United States Patent
Suzuri et al.

(10) Patent No.: US 7,699,680 B2
(45) Date of Patent: Apr. 20, 2010

(54) METHOD OF MANUFACTURING AN ORGANIC ELECTROLUMINESCENT ELEMENT

(75) Inventors: Yoshiyuki Suzuri, Musashino (JP); Atsushi Saito, Tachikawa (JP); Hiroshi Kita, Hachioji (JP); Taketoshi Yamada, Saitama (JP)

(73) Assignee: Konica Corporation (JP)

( * ) Notice: Subject to any disclaimer, the term of this patent is extended or adjusted under 35 U.S.C. 154(b) by 1297 days.

(21) Appl. No.: 11/194,881

(22) Filed: Aug. 1, 2005

(65) Prior Publication Data

US 2005/0266153 A1   Dec. 1, 2005

Related U.S. Application Data

(63) Continuation of application No. 10/449,321, filed on May 29, 2003, now Pat. No. 6,960,364.

(30) Foreign Application Priority Data

Jun. 4, 2002   (JP)   ............................. 2002-162753

(51) Int. Cl.
*B05D 5/12* (2006.01)
*B05D 1/36* (2006.01)
*B05D 5/06* (2006.01)
*H05B 33/22* (2006.01)

(52) U.S. Cl. ............................. 445/24; 427/66; 427/402; 428/690; 445/25

(58) Field of Classification Search ........................ None
See application file for complete search history.

(56) References Cited

U.S. PATENT DOCUMENTS

| 4,001,024 | A | 1/1977 | Dittman et al. |
| 6,197,418 | B1 | 3/2001 | Cloots et al. |
| 6,391,471 | B1 * | 5/2002 | Hiraoka et al. ............. 428/623 |
| 6,593,690 | B1 | 7/2003 | McCormick et al. |
| 2002/0057054 | A1 * | 5/2002 | Chung et al. ............... 313/506 |

FOREIGN PATENT DOCUMENTS

EP   0 866 644 A2   9/1998

OTHER PUBLICATIONS

European Search Report for Application No. 03011196.7-2111 dated Aug. 6, 2003.

* cited by examiner

*Primary Examiner*—Sikha Roy
*Assistant Examiner*—Tracie Green
(74) *Attorney, Agent, or Firm*—Cantor Colburn LLP

(57) ABSTRACT

Disclosed is a method of manufacturing an organic electroluminescent element comprising a substrate and provided thereon, a light emission layer and at least one layer of a hole injecting layer, a hole transporting layer, an electron injecting layer, and an electron transporting layer, two layers of the light emission layer and the at least one layer being adjacent to each other, the method comprising the steps of (a) providing a first coating solution employing a first organic solvent for one layer of the two layers and a second coating solution employing a second solvent for the other layer of the two layers, the first solvent being immiscible with the second solvent; (b) simultaneously coating the first and second coating solutions on the substrate so that the first coating solution is in contact with the second coating solution; and (c) drying the coated.

6 Claims, 2 Drawing Sheets

METHOD OF MANUFACTURING AN ORGANIC ELECTROLUMINESCENT ELEMENT

CROSS-REFERENCE TO RELATED APPLICATION

The present application is a continuation of U.S. application Ser. No. 10/449,321, filed on May 29, 2003, now U.S. Pat. No. 6,960,364 the entire contents of which are incorporated herein by reference, and which claims the benefit of the date of the earlier filed Japanese Patent Application No. JP 2002-162753 filed on Jun. 4, 2002, which is also claimed herein

FIELD OF THE INVENTION

This invention relates to an organic electroluminescent element, its manufacturing method, and its use, and particular to a method of manufacturing an organic electroluminescent element with high efficiency and at low cost.

BACKGROUND OF THE INVENTION

Recently, an organic electroluminescent (EL) element has been studied which is used in a display such as a flat display, or in a light source for an electrophotographic copier or a printer.

An organic EL element has a structure in which a layer containing an organic fluorescent compound is arranged between a cathode and an anode, and an electron and a positive hole were injected into the light emission layer and recombined to form an exciton. The element emits light, utilizing light (fluorescent light or phosphorescent light) generated by deactivation of the exciton, and the element can emit light by applying a relatively low voltage of from several to several decade volts. The element has a wide viewing angle and a high visuality since the element is of self light emission type. Further, the element is a compact, complete solid element, and is noted from the viewpoint of space saving and portability. Therefore, study for practical application of the element has been made.

Recently, a phosphorescence organic EL element employing an excited triplet state, which surpasses a conventional organic EL element employing an excited singlet state, has been proposed by S. R. Forrest et al. (Appl. Phys. Lett. (1999), 75 (11), 4-6). Further, an organic EL element attaining a visibility efficiency of 60 lm/W was reported by C. Adachi et al. (J. Appl. Phys., 90, 5048 (2001)). Application of the organic EL elements described above to an illuminator as well as a display is expected.

However, when an illuminator employing an organic EL element is manufactured, the following must be considered.

As organic electroluminescent materials (EL materials), there are lower molecular weight EL materials and high molecular weight EL materials. When the lower molecular weight EL materials are used in the manufacture of an EL element, vacuum deposition is carried out. The lower molecular weight EL materials, which can be purified by sublimation, are easy to be purified, which provides El materials with high purity. Further, the lower molecular weight EL materials are easy in obtaining a multilayer structure, and are excellent in productive efficiency or lifetime. However, since deposition is carried out under high vacuum condition of a pressure of not more than $10^{-4}$ Pa, operation is complex, and expensive. Accordingly, the deposition method is not necessarily preferable in the manufacture. Particularly, a large size EL element, which is necessary for illuminator use, is difficult to manufacture. Further, regarding phosphorescent dopants, which are used in a phosphorescence organic EL element, it is difficult to form plural layers with a large size of the phosphorescent dopants without unevenness by vacuum deposition, and obtain an organic EL element. The vacuum deposition is disadvantageous in cost of manufacture and in manufacturing technology.

In contrast, when the high molecular weight EL materials are used in the manufacture of an EL element, a wet process such as a spin coating method, an ink jet method, or a printing method can be used. The wet process can be carried out under atmospheric pressure, has an advantage in low cost. Further, it can form a thin layer employing a solution of the materials, it has advantages in that dopants can be easily controlled and a large sized layer without unevenness can be easily obtained. When an illuminator employing an organic EL element is manufactured, this process is advantageous in cost of manufacture and in manufacturing technology.

However, the wet process employing the high molecular weight EL materials is difficult in forming a multilayer structure. When a second coating solution of a second high molecular weight EL material is coated on a first solution of a first high molecular weight EL material, the first high molecular weight EL material is dissolved in a second solvent used in the second coating solution, the first and second materials are mixed. This lowers productive efficiency as compared with the process used in the manufacture of an EL element employing the lower molecular weight EL materials.

Generally, an organic EL element comprising high molecular weight materials is manufactured by a spin coating method, an ink jet method or a printing method.

The organic EL element cab be manufactured sheet by sheet by the spin coating method, but cannot continuously. The ink jet method is useful for the manufacture of a display emitting three color lights, but is disadvantageous in productivity to the manufacture of a luminator or a luminous device emitting the same color light such as a display of a color conversion type.

A printing method is disclosed in Japanese Patent O.P.I. Publication Nos. 3-269995, 10-77467, and 11-273859. The printing method is a simple and useful method. However, the printing method is a method forming a layer one by one, and when two or more layers are formed according to the printing method, one layer is formed, and then another layer is formed on the resulting layer. This not only lowers productivity but increases cost due to increase of manufacturing installations or processes. Further, when layers of an organic solvent soluble polymer are multi-layered, there is a problem in that two layers are mixed.

SUMMARY OF THE INVENTION

In view of the above, the present invention has been made. An object of the invention is to provide a method of manufacturing an organic EL element employing a wet process solving the above problem occurring on multi-layering. Another object of the invention is to provide a method of manufacturing an organic EL element at low cost and at high efficiency.

BRIEF EXPLANATION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
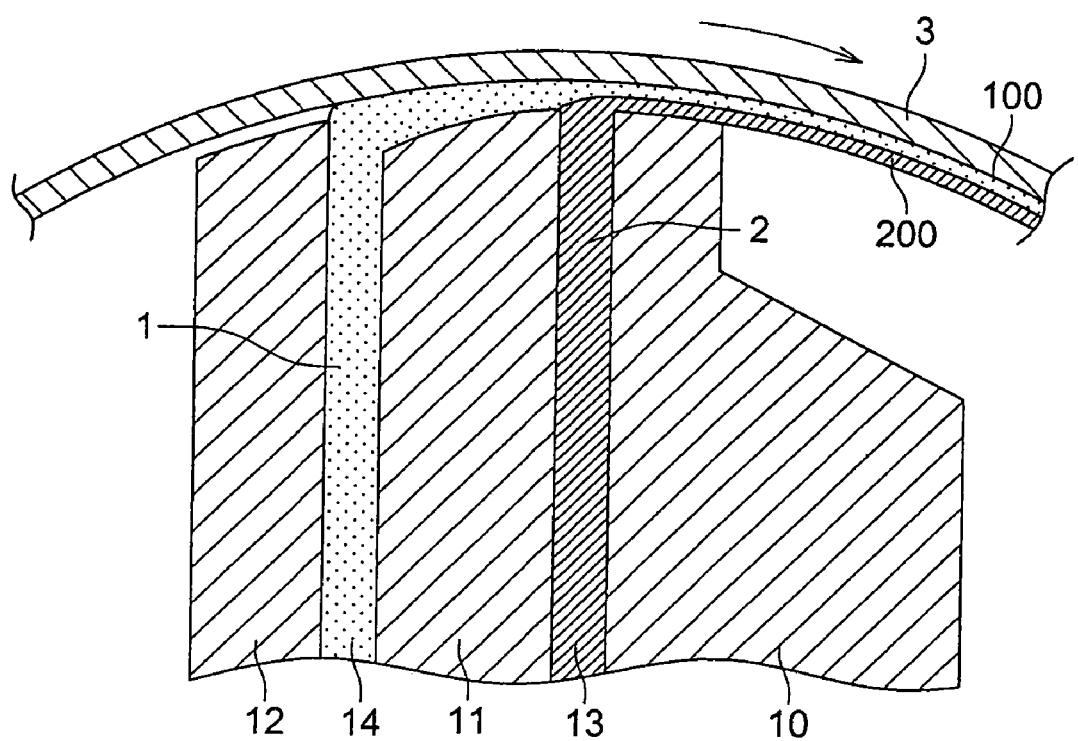
FIG. 1 is an illustration of a slot coating method simultaneously coating two layers on a substrate.

The above object of the invention can be attained by the following constitution:

A method of manufacturing an organic electroluminescent element comprising a substrate and provided thereon, a light emission layer containing a light emission material and at least one layer of a hole injecting layer containing a hole injecting material, a hole transporting layer containing a hole transporting material, an electron injecting layer containing an electron injecting material, and an electron transporting layer containing an electron transporting material, two layers of the light emission layer and the at least one layer being adjacent to each other, the method comprising the steps of (a) providing a first coating solution employing a first organic solvent for one layer of the two layers and a second coating solution employing a second solvent for the other layer of the two layers, the first solvent being immiscible with the second solvent; (b) simultaneously coating the first and second coating solutions on the substrate so that the first coating solution is in contact with the second coating solution; and (c) drying the coated to form the two layers on the substrate.

The method of item 1-1 above, wherein one of the first and second solvents is water and the other is an organic solvent.

The method of item 1-1 above, further comprising the step of forming a layer other than the two layers on the substrate according to a method selected from the group consisting of a vacuum deposition method, an ink jet method, a printing method and a spin coating method.

The method of item 1-1 above, wherein the simultaneously coating is carried out employing a slide coating method or a slot coating method.

The method of item 1-1 above, wherein the substrate is flexible.

The method of item 1-1 above, wherein one layer of the two layer is the light emission layer.

A method of manufacturing an organic electroluminescent element comprising a substrate and provided thereon, a light emission layer containing a light emission material and at least one layer of a hole injecting layer containing a hole injecting material, a hole transporting layer containing a hole transporting material, an electron injecting layer containing an electron injecting material, and an electron transporting layer containing an electron transporting material, two layers of the light emission layer and the at least one layer being adjacent to each other, the method comprising the steps of (a) providing a first coating solution employing a first organic solvent for one layer of the two layers, a second coating solution employing a second solvent for the other layer of the two layers, and a third solvent, the third solvent being immiscible with both the first solvent and second solvent; (b) simultaneously coating the first and second coating solutions, and the third solvent on a substrate so that the third solvent is in contact with the first and second coating solutions and is provided between the first coating solution and the second coating solution; and (c) drying the coated to form the two layers on the substrate.

The method of item 1-7 above, wherein one of the first and second solvents is water and the other is an organic solvent.

The method of item 1-7 above, further comprising the step of forming a layer other than the two layers on the substrate according to a method selected from the group consisting of a vacuum deposition method, an ink jet method, a printing method and a spin coating method.

The method of item 1-7 above, wherein the simultaneously coating is carried out employing a slide coating method or a slot coating method.

The method of item 1-7 above, wherein the substrate is flexible.

An organic electroluminescent element manufactured by the method of item 1-1 above.

The organic electroluminescent element of item 1-12 above, wherein light emitted from the element is base on phosphorescence.

The organic electroluminescent element of item 1-12 above, wherein light emitted from the element is a white light.

The organic electroluminescent element of item 1-12 above, wherein the light is a blue light.

An illuminator comprising the organic electroluminescent element of item 1-12 above.

A display comprising the organic electroluminescent element of item 1-12 above.

2-1. A method of manufacturing an organic electroluminescent element comprising a substrate and provided thereon, a first layer and a second layer, which is other than the first layer, the first and second layers being adjacent to each other, the method comprising the steps of (a) providing a first coating solution for the first layer employing a first organic solvent and a second coating solution for the second layer employing a second solvent, the first coating solution being immiscible with the second coating solution; and (b) simultaneously coating the first and second coating solutions on the substrate so that the first coating solution is in contact with the second coating solution.

2-2. A method of manufacturing an organic electroluminescent element comprising a substrate and provided thereon, a first layer and a second layer, which is other than the first layer, the first and second layers being adjacent to each other, the method comprising the steps of (a) providing a first coating solution for the first layer containing a water soluble organic materials and a second coating solution containing an organic solvent soluble organic materials for the second; and (b) simultaneously coating the first and second coating solutions on the substrate so that the first coating solution is in contact with the second coating solution.

2-3. The method of item 2-2 above, further comprising the step of forming a third layer other than the first layer and second layer on the substrate according to a method selected from the group consisting of a vacuum deposition method, an ink jet method, a printing method and a spin coating method.

2-4. The method of item 2-1,2-2, or 2-3 above, the method comprising the steps of (a) further providing an intermediate third solvent containing no organic materials; and (b) simultaneously coating the first and second coating solutions, and the third solvent on the substrate.

2-5. The method of any one of items 2-1 through 2-4 above, wherein the simultaneously coating is carried out employing a slide coating method or a slot coating method.

2-6. The method of any one of items 2-1 through 2-5 above, wherein the substrate is flexible.

2-7. An organic electroluminescent element which is manufactured by the method of any one of items 2-1 through 2-6 above.

2-8. The organic electroluminescent element of item 2-7 above, wherein light emitted from the element is base on phosphorescence.

2-9. The organic electroluminescent element of item 2-7 or 2-8 above, wherein the light is a white light.

2-10. The organic electroluminescent element of item 2-7 or 2-8 above, wherein the light is a blue light.

2-11. An illuminator comprising the organic electroluminescent element of any one of items 2-7 through 2-10 above.

2-12. A display comprising the organic electroluminescent element of any one of items 2-7 through 2-10 above.

The present inventors have found that a method is advantageous in forming an interface between coated layers which coats on a substrate a first coating solution employing a first solvent and a second coating solution employing a second solvent so that the first coating solution is in contact with the second coating solution, the first solvent and the second solvent being immiscible with each other, or coats on a substrate a third coating solution in which polymeric organic materials are dissolved in an aqueous solvent, and a fourth coating solution in which solvent soluble polymeric organic materials are dissolved in an organic solvent solution so that the third coating solution is in contact with the fourth coating solution, and attained the invention.

Herein, "the first solvent and the second solvent being immiscible with each other" is such that after the first solvent is added to the second solvent in the same amount as the first solvent at 25° C. while stirring, and allowed to stand at 25° C. for 30 to 60 minutes, the resulting liquid is separated into two liquid phases to form an interface between the two liquid phases.

The present invention will be detailed below.

Generally, an organic EL element comprises plural layers of an organic compound, but may comprise a layer (such as a layer of lithium fluoride or an inorganic metal salt, or a layer containing them) other the layers of the organic compound.

The layers of the organic compound comprises at least two layers including a light emission layer having the regions (light emission regions) where light is emitted due to a recombination of holes and electrons injected from a pair of electrodes, and an adjacent layer adjacent to the light emission layer. The light emission regions may occupy the whole of the light emission layer, or a part in the thickness direction of the light emission layer. Further, the light emission regions may be an interface between the light emission layer and the adjacent layer. In the invention, when two layers show the light emission regions, one is a light emission layer and the other is an adjacent layer adjacent to the light emission layer.

The adjacent layer, which will be described later, can be broadly classified into two, that is, a hole transporting layer and an electron transporting layer due to its function. Further, the adjacent layer can be narrowly classified into a hole injecting layer, a hole transporting layer, an electron blocking layer, an electron injecting layer, an electron transporting layer, and a hole blocking layer due to its function.

In the invention, preferred examples of a layer constitution of the organic EL element of the invention will be shown below, but the present invention is not limited thereto.

Anode/Hole transporting layer/Electron transporting light emission layer/Cathode Anode/Hole transporting layer/Electron transporting light emission layer/Electron transporting layer/Cathode Anode/Hole injecting layer/Hole transporting layer/Electron transporting light emission layer/Cathode Anode/Hole transporting light emission layer/Electron transporting layer/Cathode Anode/Hole transporting layer/Hole transporting light emission layer/Electron transporting layer/Cathode Anode/Hole injecting layer/Hole transporting layer/Hole transporting light emission layer/Electron transporting layer/Cathode Anode/Hole transporting layer/Electron transporting light emission layer/Electron transporting layer/Cathode Anode/Hole transporting light emission layer/Electron transporting layer/Electron injecting layer/Cathode Anode/Hole injecting layer/Hole transporting light emission layer/Hole blocking layer/Electron transporting layer/Electron injecting layer/Cathode In the above, the hole transporting light emission layer or electron transporting light emission layer is a light emission layer, and a layer adjacent to the light emission layer are an adjacent layer.

The light emission layer ordinarily contains host and a dopant. With respect to the host and dopant contained in the light emission layer, when the light emission layer is comprised of a mixture of two or more kinds of compounds, the compound having a highest content in the mixture is the host and the compound having a lower content in the mixture is the dopant. For example, when the compound A to compound B ratio (by weight) in the light emission layer is 10:90, compound A is a dopant, and the compound B is a host.

Further, when the content ratio, compound A:compound B:compound C in the light emission layer is 5:10:85, compounds A and B are dopants, and compound C is a host.

The content ratio of the dopant is preferably 0.001 to less than 50% by weight, and the content ratio of the host is preferably 50 to less than 100% by weight.

The dopant will be explained below.

The dopant is divided in two types in principle, one is an energy transfer type in which recombination of a carrier occurs on the host to which the carrier is transported to excite the host, the resulting energy is transferred to the dopant, and light is emitted from the dopant, and the other is a carrier trap type in which recombination of a carrier occurs on the dopant, a carrier trap material, and light is emitted from the dopant. However, in each type of the dopant, energy level of the dopant in excited state is lower than that of the host in excited state.

In the energy transfer type, as condition easily transferring energy, the overlapping integral between emission of the host and absorption of the dopant is greater. In the carrier trap type, it is necessary to have an energy relationship in which a carrier is easily trapped. For example, when an electron carrier is trapped, it is necessary that electron affinity (LUMO level) of the dopant be higher than that (LUMO level) of the host. On the contrary, when a hole carrier is trapped, it is necessary that ionization potential (HOMO level) of the dopant be lower than that (HOMO level) of the dopant.

In view of the above, the dopant compound as a dopant can be selected based on emission efficiency and emission color including color purity, and the host compound can be selected from compounds which have a good carrier transporting property and satisfy the relationship as described above.

The dopant in the light emission layer can be used selecting from known ones used as the dopant of the EL element, but is preferably an organic compound or a complex each emitting fluorescence or phosphorescence.

A fluorescent dopant is preferably a compound with high fluorescent quantum yield, which is represented by a laser dye. A phosphorescent dopant is preferably a compound capable of emitting phosphorescence at room temperature, for example, an iridium complex, a platinum complex or a europium complex, but is not limited thereto.

Such a host compound can be used optionally selecting from known materials used in the organic EL element, and many of the hole transporting materials or electron transporting materials as described above can be used as the host of the light emission layer. A polymer such as polyvinyl carbazol or polyfluorenone can be used, and a polymer in which the host compound mentioned above is introduced in the polymer chain or a polymer having the host compound as the polymer main chain can be also used.

The host compound is preferably a compound with high Tg (glass transition temperature), which has a hole and electron transporting ability, and prevents the emission wavelength shifting to longer wavelength.

Such an organic compound can be prepared for example by arranging the π electron planes of the chemical structure in different planes according to effect of steric hindrance. For example, there is mentioned of a method in which introducing a substituent causing steric hindrance in the ortho position (to a nitrogen atom) of aryl groups in triarylamine, whereby a twisted angle formed between the aryl groups is increased. That is, an emission compound with high Tg, which can emit light with a shorter wavelength, can be obtained without lowering the Tg by introducing a steric hindrance providing substituent such as a methyl group, a t-butyl group, an isopropyl group, or a naphthyl group (a hydrogen atom at a peri-position) in the organic compound, although a hole or electron transporting ability is slightly lowered. The substituents are not limited to the above.

The compound can be also obtained by introducing a conjugated group in the non-conjugated position of an aromatic ring (for example, the meta position of the phenyl group in triphenylamine).

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 µm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 µm, and preferably from 10 to 200 nm, although it may vary due to kinds of materials used.

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 µm, and preferably from 50 to 200 nm. It is preferable in increasing the light emission efficiency that either the anode or the cathode of the organic EL element is transparent or semi-transparent.

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is a hole transporting layer in a broad sense, and is comprised of material having an ability of transporting holes but an extremely poor ability of electrons, which can increase a recombination probability of electrons and holes by transporting holes and blocking electrons.

The hole transporting layer is comprised of material having an ability of transporting holes, and a hole injecting layer and an electron blocking layer are included in the hole transporting layer in a broad sense.

The hole transporting layer or electron transporting layer may be a single layer or plural layers.

The hole transporting materials are not specifically limited, and can be optionally selected from those employed for hole transporting materials in conventional photoconductive elements or known materials used in the hole injecting layer or hole transporting layer of conventional EL elements.

The hole transporting material described above may be either an organic substance or an inorganic substance as long as it has a hole injecting ability, a hole transporting ability or an ability to form a barrier to electrons. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable.

In the invention, the hole transporting material contained in the hole transporting layer adjacent to the light emission layer is preferably a compound having a maximum fluorescence wavelength of not longer than 415 nm.

The electron transporting materials are not specifically limited, and can be optionally selected from known compounds used as the hole transporting materials of conventional EL elements.

Examples of the electron transporting material include a phenanthroline derivative, a bipyridine derivative, a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative, an anthraquinodimethane an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material or electron injecting material.

A polymer in which the material mentioned above is introduced in the polymer chain or a polymer having the material as the polymer main chain can be also used. A metal complex can be also used.

A substrate preferably employed for the organic electroluminescent element in the invention is not restricted to specific kinds of materials such as glass and plastic, as far as it is transparent. Examples of the substrate preferably used include glass, quartz and light transmissible plastic film. Especially preferred one is flexible and a resin film capable of providing flexibility to the organic EL element.

Examples of the resin film include films of polyethyleneterephthalate (PET), polyethylenenaphthalate (PEN), polyethersulfone (PES), polyetherimide, polyetheretherketone, polyphenylenesulfide, polyarylate, polyimide, polycarbonate (PC), cellulose triacetate (TAC), cellulose acetate propionate (CAP) and so on.

The surface of the resin film may have a layer of an inorganic or organic compound or a hybrid layer of both compounds.

A passivation layer, which prevents oxygen or moisture from permeating, may be provided on the substrate. The passivation layer is preferably an inorganic layer of an inorganic compound such as an inorganic oxide or nitride or an organic layer such as a polymer layer. Examples of the inorganic compound include silicon oxide, silicon nitride, silicon oxide nitride, and magnesium oxide. The polymer layer may be formed employing a wet process, a deposition polymerization process or a photopolymerization process. Further, the organic layer and the inorganic layer may be laminated. The passivation layer described above can inhibit the oxygen or moisture permeation.

After preparation of an organic EL element, the element is preferably subjected to sealing treatment, which prevents its deterioration due to oxygen or moisture. Sealing treatment may be carried out employing SUS, aluminum, aluminum alloy or glass to form a sealing layer, in which flexibility is lost. The sealing layer is preferably a passivation layer or a film, and more preferably a passivation layer. Examples of the passivation layer include those described above.

A film for sealing may be provided on the passivation layer, in which a passivation layer may be provided on the film.

When two organic layers as described above adjacent to each other are formed on a substrate, a first coating solution in which a soluble material is dissolved in a first organic solvent, and a second coating solution in which a soluble material is dissolved in a second organic solvent are simultaneously coated on the substrate so that the first coating solution is in contact with the second coating solution, the first organic solvent being immiscible with the second organic solvent, and dried, or a third coating solution in which a water soluble material is dissolved in an aqueous solvent, and a fourth coating solution in which an organic solvent soluble material is dissolved in an organic solvent are simultaneously coated on the substrate so that the third coating solution is in contact with the fourth coating solution, and dried. Drying temperature is preferably from 15 to 200° C., and more preferably from 50 to 150° C. The drying is carried out preferably in an inert gas atmosphere, the moisture or oxygen content of the inert gas atmosphere being preferably not more than 20 ppm.

Layers constituting the organic EL element of the invention include a hole injecting layer, a hole transporting layer, a light emission layer, an electron transporting layer and so on. Materials used in these layers will be explained below.

As the hole injecting materials used in the hole injecting layer, a conjugated polymer, a non-conjugated polymer and an oligomer compound are used, each being ordinarily doped with an acceptor in order to increase electric conductivity.

Examples of the conjugated polymer include polythiophenes and polyanilines, each ordinarily being doped with an acid as an acceptor. Of the polyathiophenes, PEDOT/PSS is preferred, and of the polyanilines, PANI/CSA is preferred.

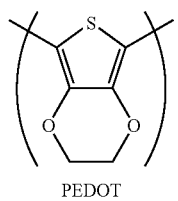

PEDOT

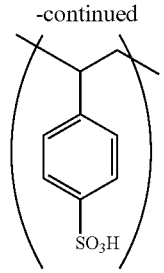

PSS

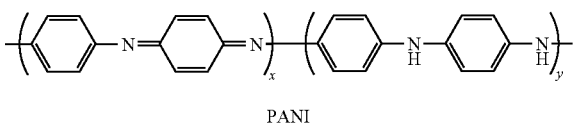

PANI $0 < x$ (mol %) $< 100$, y (mol %) $= 100 - x$

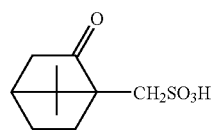

CSA

The non-conjugated polymers include polymers containing aromatic amines, which include those containing aromatic amines in the main polymer chain or in the side chain, for example, those represented by the following formula 1 or 2 described later. Examples of the non-conjugated polymers include PC-TPB-DEG, PTPDES, Et-PTPDEK, PVTPAI, and PVTPA2.

Formula 1

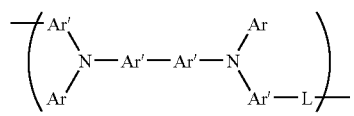

Formula 2

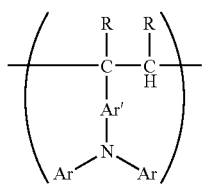

PC-TPB-DEG

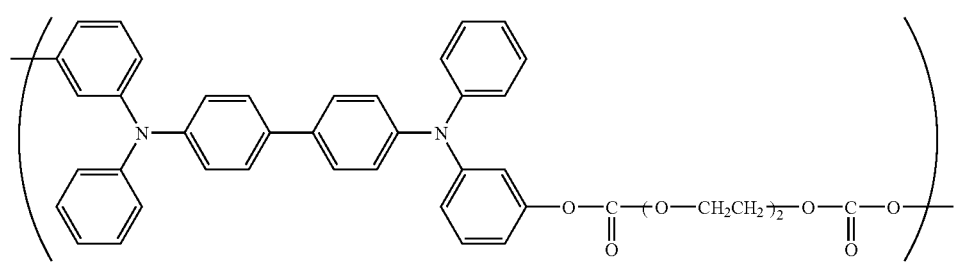

PTPDES

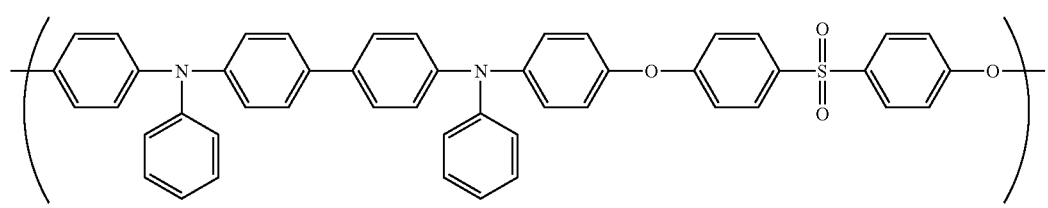

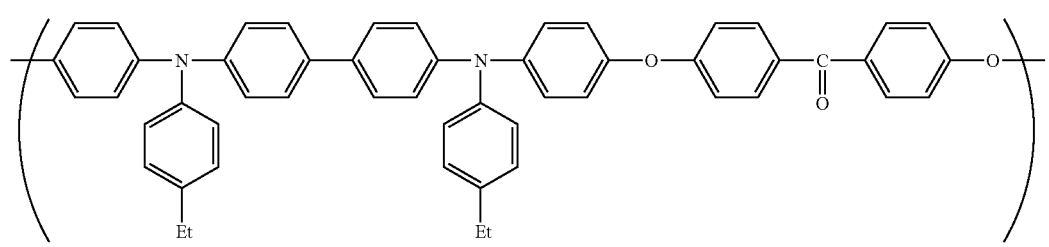

Et-PTPDEK

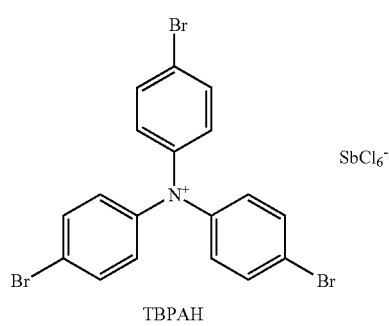

PVTPA1

PVTPA2

The acceptors are preferably those having extremely high electron-accepting property. Examples thereof include TBPAH, and quinones, and DDQ is especially preferred.

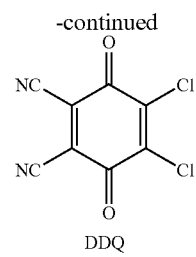

DDQ

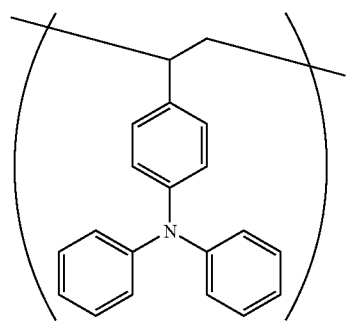

TBPAH

The oligomer compounds include aromatic amine oligomers. The oligomers have a structure in which aromatic amine units are connected, but can be purified by sublimation, and can form a coated layer with a good amorphous property. The oligomer compounds are, for example, those represented by the following formula 3, 4, 5, or 6 described later. Examples thereof include the following compounds 3-1 through 3-5, 4-1 through 4-4, 5-1 through 5-4, and 6-1 through 6-3.

Compound 3-1

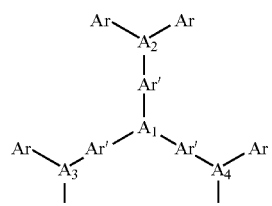

$A_1$ to $A_4$: N, P, or B

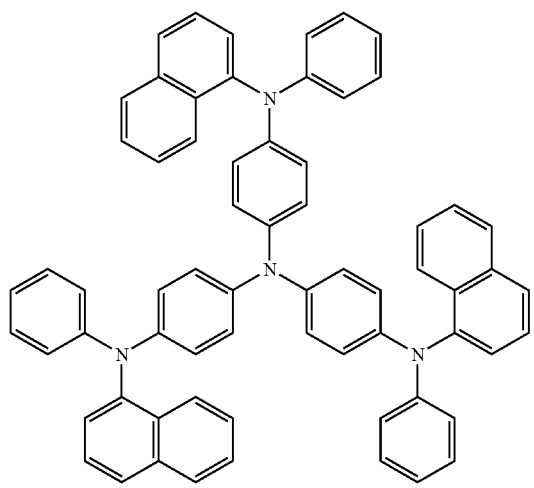

-continued
Compound 3-2
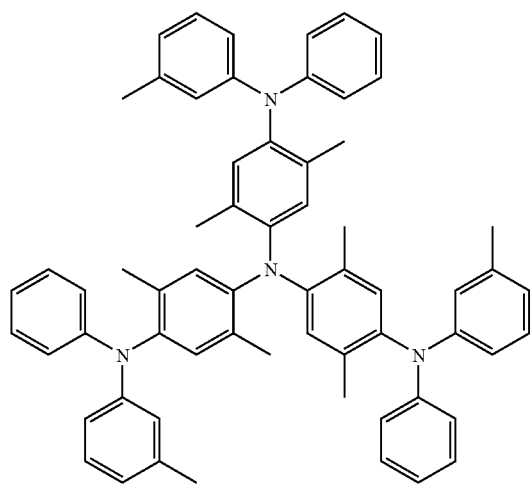
Compound 3-3
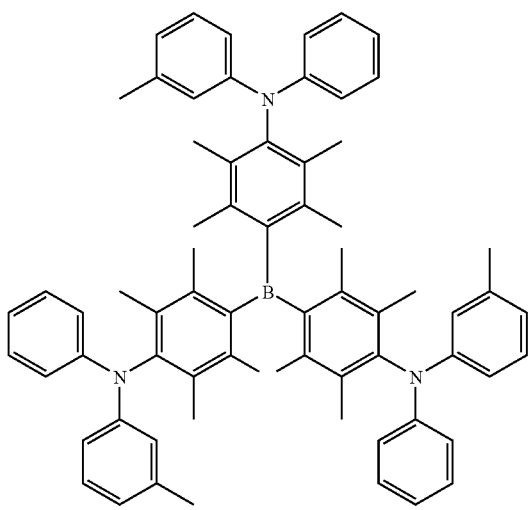
Compound 3-4
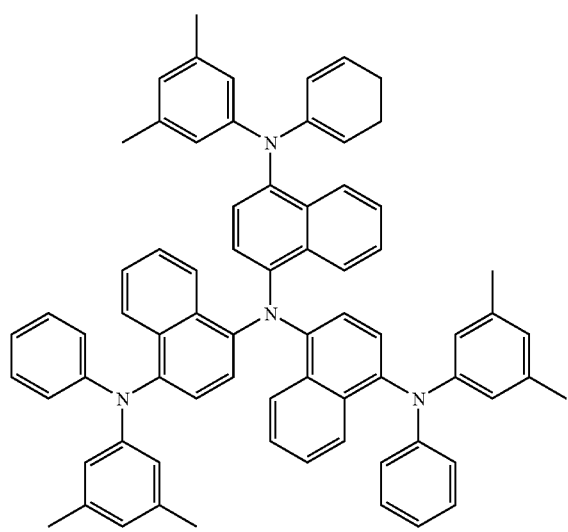
Compound 3-5
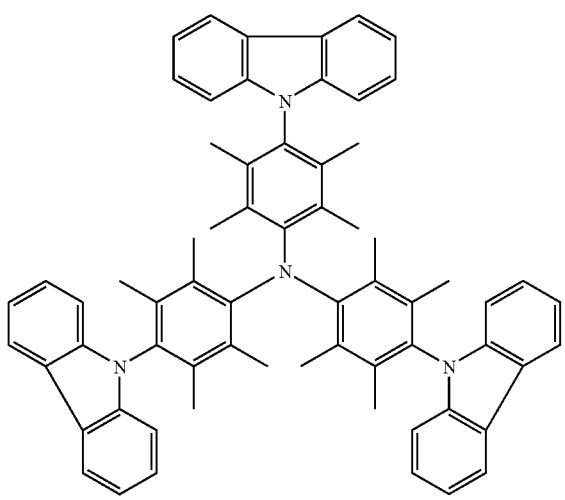
Formula 4
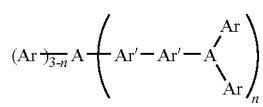
A: N, B, or P
n = 2, or 3
Compound 4-1
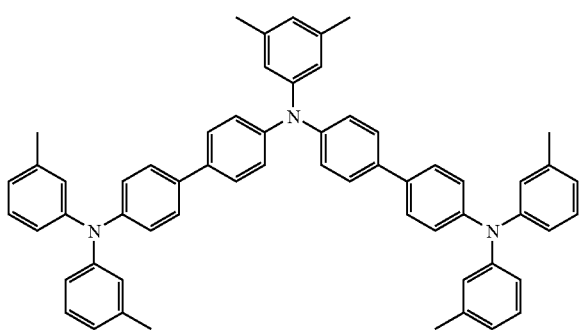

-continued
Compound 4-2
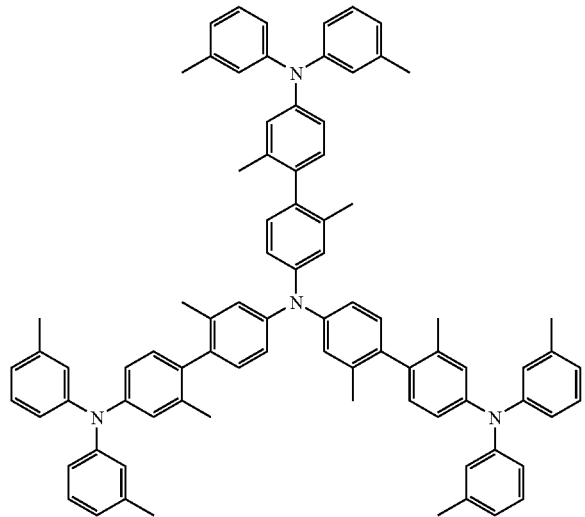
Compound 4-3
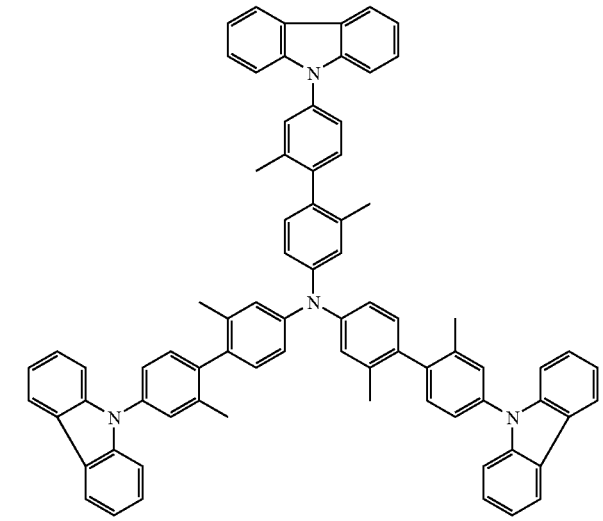
Compound 4-4
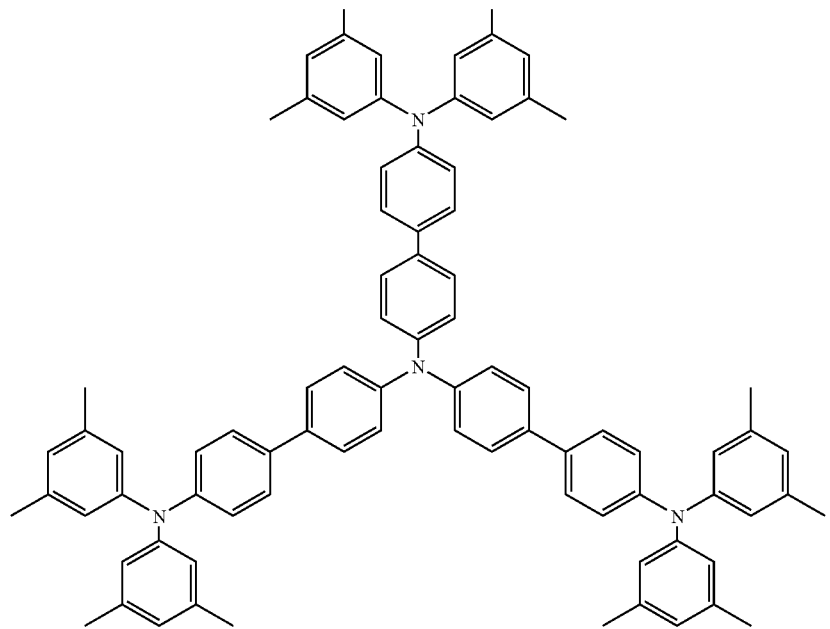
Formula 5
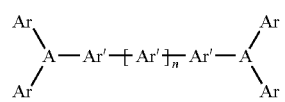
A: N, P or B
n = 1 to 3
Compound 5-1
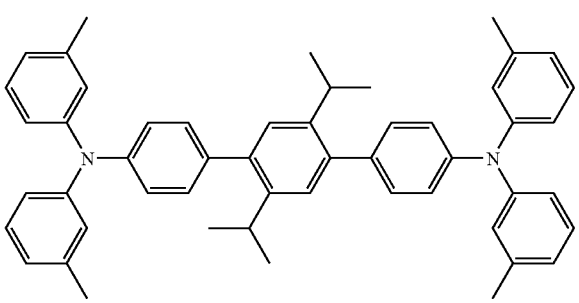

-continued
Compound 5-2
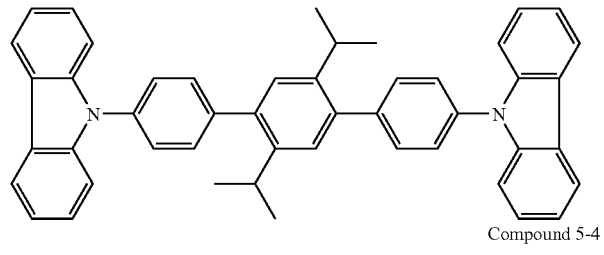
Compound 5-3
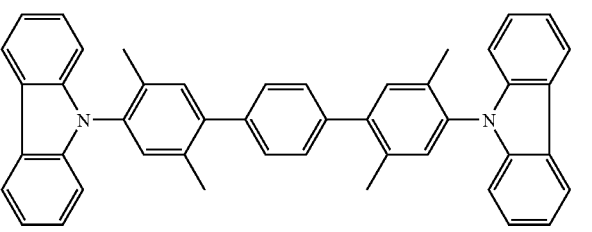
Compound 5-4
Formula 6
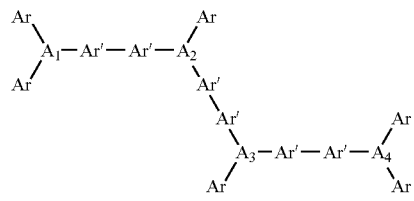
A1, A2, A3, and A4 independently represent N, P, or B.
Compound 6-1
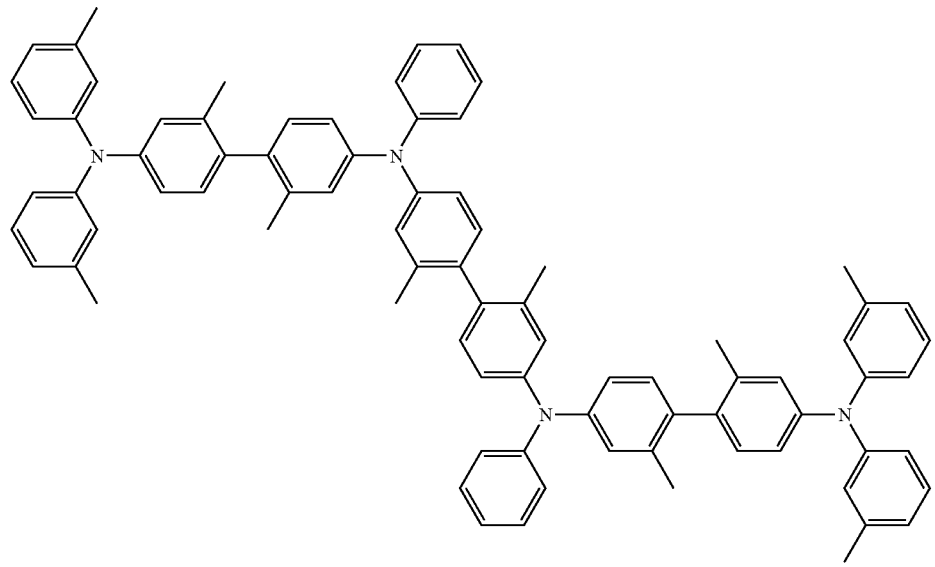
Compound 6-2
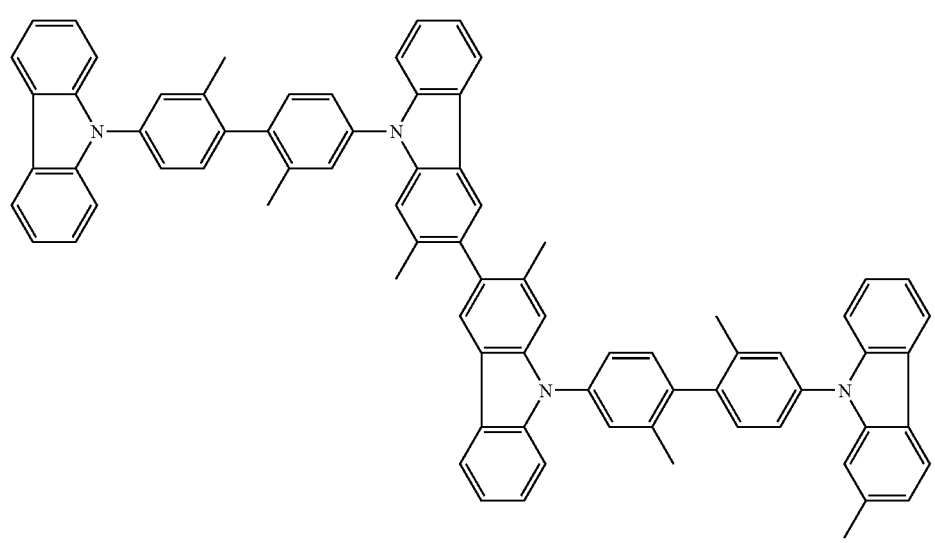

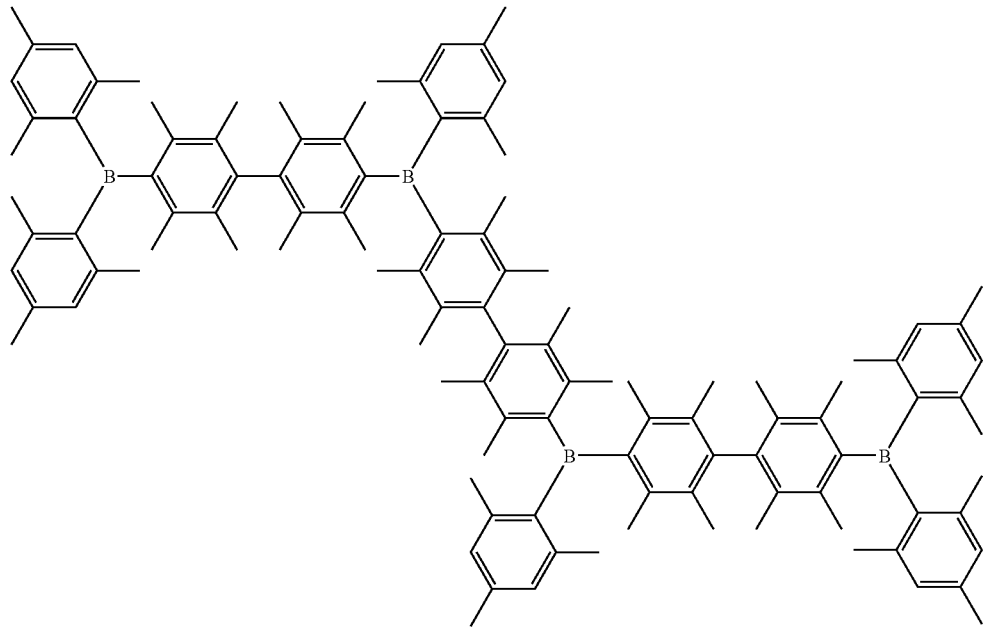

Compound 6-3

The acceptors are preferably those having extremely high electron-accepting property. Examples thereof include TBPAH, and quinones, and DDQ is especially preferred.

As the hole transporting materials in the hole transporting layer, polymers containing aromatic amines, amorphous low molecular weight compounds, and liquid crystal compounds are used.

The polymers containing aromatic amines are those containing aromatic amines in the main polymer chain or in the side chain, for example, those represented by formula 1 or 2 described above. The polymers are preferably PC-TPB-DEG, PTPDES, Et-PTPDEK, PVTPAI, and PVTPA2.

The amorphous low molecular weight compounds are compounds which can be purified by sublimation and provide a coated layer with good amorphous property.

Examples of the amorphous low molecular weight compounds include aromatic amine oligomers. The oligomers have a structure in which aromatic amine units are connected, but can be purified by sublimation, and can form a coated layer with a good amorphous property. The oligomer compounds are, for example, those represented by formula 3, 4, 5, or 6 described above. Examples thereof include compounds 3-1 through 3-5, 4-1 through 4-4, 5-1 through 5-4, and 6-1 through 6-3.

The liquid crystal compounds may be any compounds, as long as they show a liquid crystal property, and include triphenylene derivatives or polyfluorene derivatives showing discotic property.

The hole transporting layer may contain a dopant with a hole transporting property in order to enhance a hole transporting property.

As the light emission materials in the light emission layer, a conjugated polymer, a non-conjugated polymer and an amorphous low molecular weight compound are used.

Examples of the conjugated polymer include polyphenylene vinylene derivatives, polythiophene derivatives, poly(p-phenylene) derivatives, polyacetylene derivatives, and polymers having a phosphorescent molecule in the main chain.

The polyphenylene vinylene derivatives are those represented by the following formula 7, and examples thereof include PPV, RO-PPV, and CN-PPV.

Formula 7

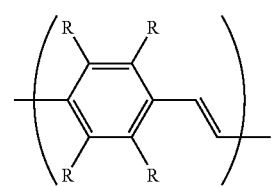

Mw = 500-100,000

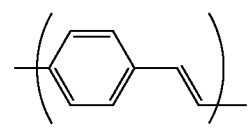

PPV

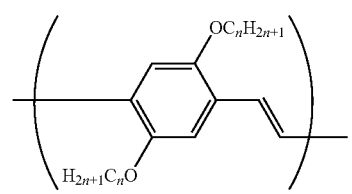

RP-PPV

"n" is an integer of 1 to 30.

-continued

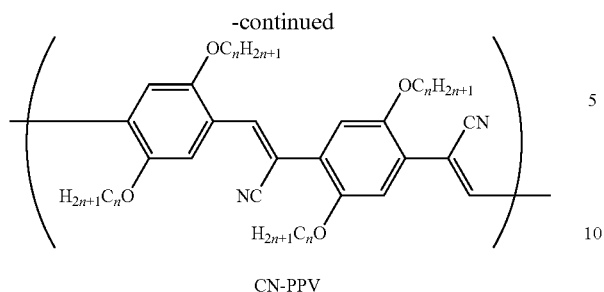

CN-PPV

"n" is an integer of 1 to 30.

The polythiophene derivatives are those represented by the formula 8, and examples thereof include PAT, PCHMT, and POPT.

Formula 8

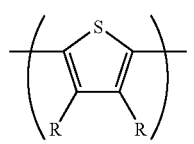

PAT

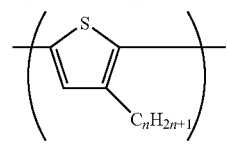

PCHMT

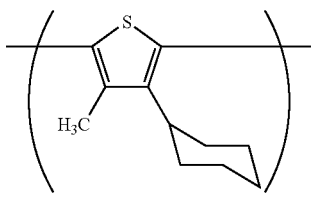

POPT

The poly(p-phenylene) derivatives are those represented by the following formula 9, and examples thereof include PPP, RO-PPP, FP-PPP, and PDAF.

Formula 9

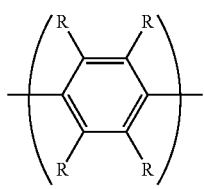

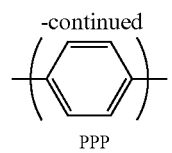

PPP

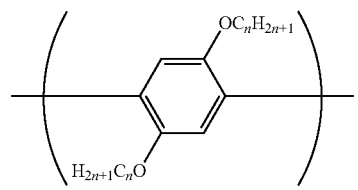

RO-PPP

"n" is an integer of 1 to 30.

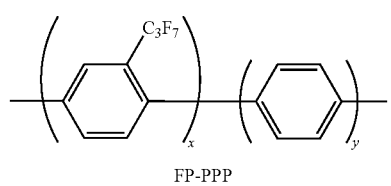

FP-PPP $0 < x$ (mol %) $< 100$, y (mol %) = 100 - x

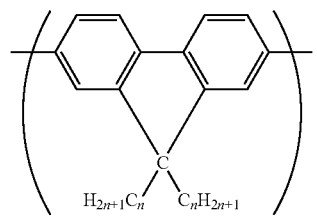

PDAF

"n" is an integer of 1 to 30.

The polyacetylene derivatives are those represented by the following formula 10, and examples thereof include PPA, and PDPA.

Formula 10

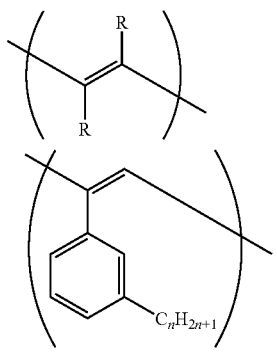

PPA

"n" is an integer of 1 to 30.

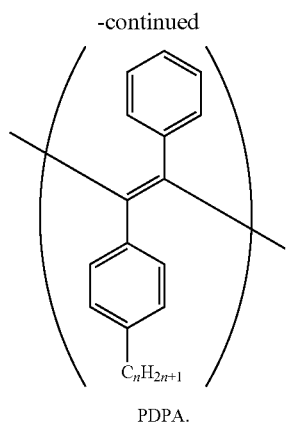

PDPA.

"n" is an integer of 1 to 30.

The polymers having a phosphorescent molecule in the main chain are those in which a phosphorescent molecule capable of emitting phosphorescence is incorporated in the polymer main chain. The phosphorescent molecules are preferably an orthometal complex and a platinum complex, and especially preferably an Ir complex. The polymers are those represented by the following formula 11, and examples thereof include compounds 11-1 and 11-2.

Formula 11

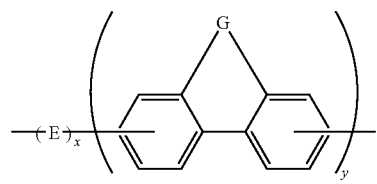

E: Ir complex, G: > N-R, or —C(R)$_2$—
0 < x (mol %) < 100, y (mol %) = 100 - x

Compound 11-1

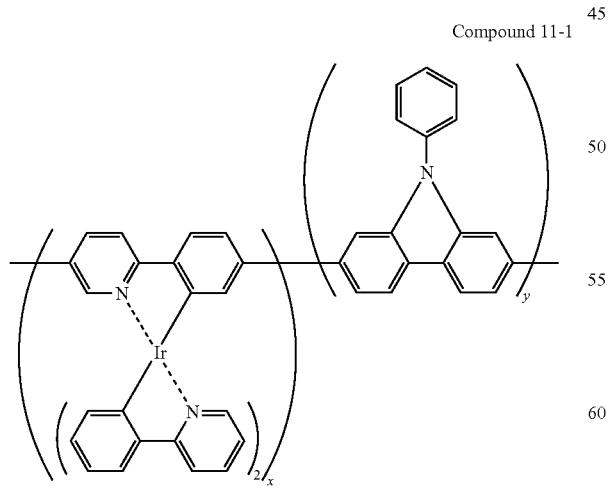

0 < x (mol %) < 100, y (mol %) = 100 - x

Compound 11-2

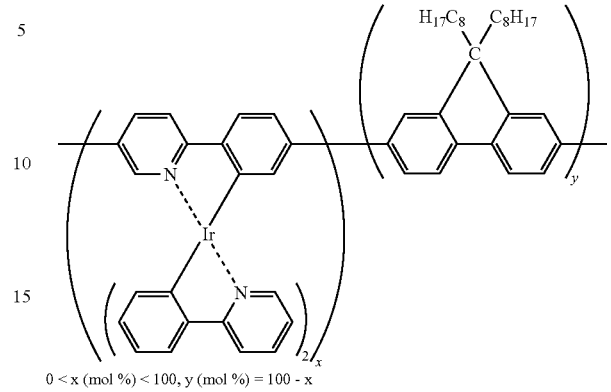

0 < x (mol %) < 100, y (mol %) = 100 - x

The non-conjugated polymers have functional molecules in the polymer side chain. The polymers are those represented by the following formula 12, and examples thereof include PVCz and compound 12-1.

Formula 12

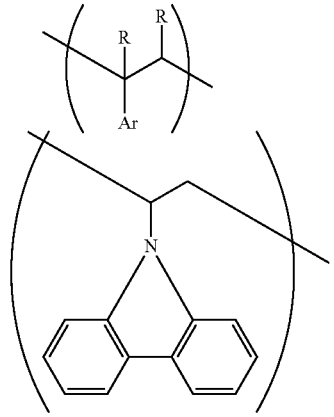

PVCz

Compound 12-1

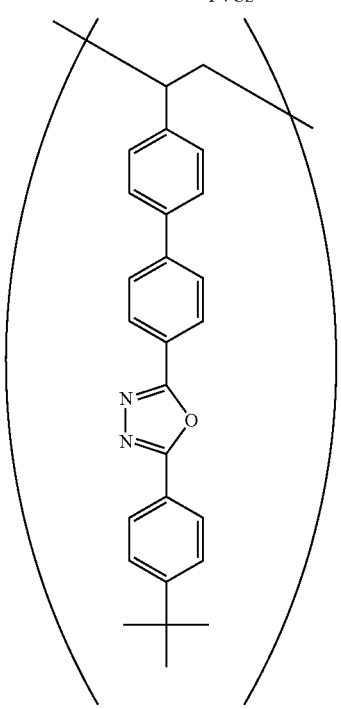

The non-conjugated polymers may be those having phosphorescent molecules in the polymer side chain. The polymers are those represented by the following formula 13, and examples thereof include compounds 13-1 and 13-2.
Formula 13
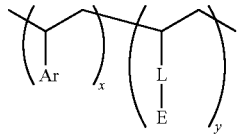
L: linkage group, E: Ir complex
0 < x (mol %) < 100, y (mol %) = 100 - x
Compound 13-1
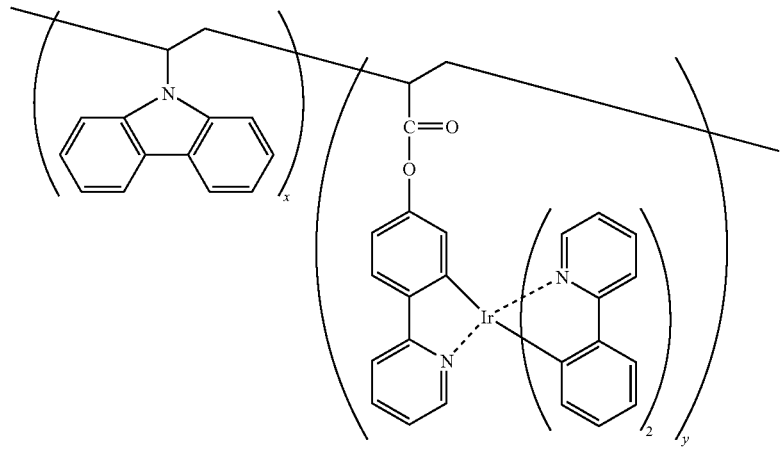
0 < x (mol %) < 100,
y (mol %) = 100 - x
Compound 13-2
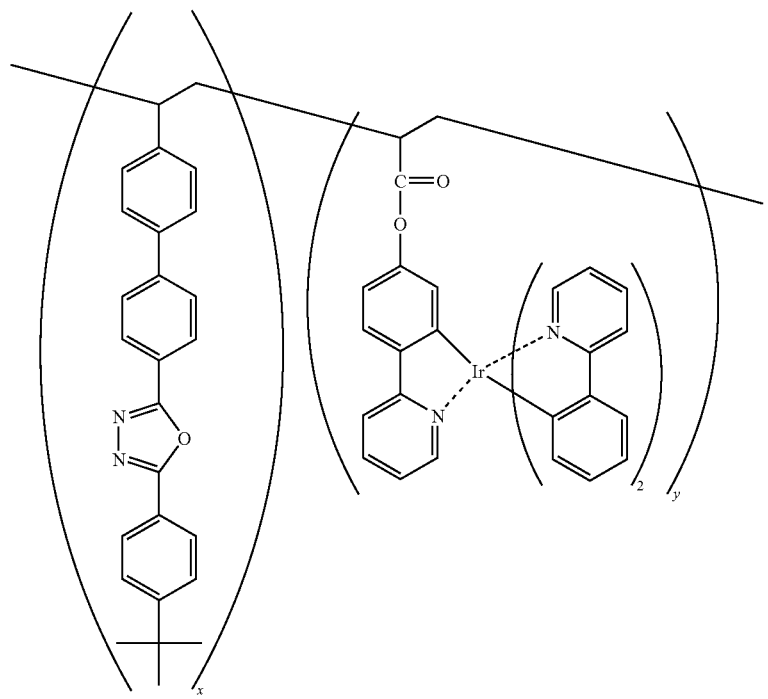
0 < x (mol %) < 100,
y (mol %) = 100 - x The amorphous low molecular weight compounds are compounds as described above which can be purified by sublimation and provide a coated layer with good amorphous property. The compounds providing a high amorphous property are preferably those having a high Tg (glass transition point). The compounds are those represented by formula 3, 4, 5 or 6 above or those represented by the following formula 14, 15, 16, or 17. Examples of the compounds include compounds 3-1 through 3-5, 4-1 through 4-4, 5-1 through 5-4, 6-11 through 6-3, 14-1 through 14-15, 15-1 through 15-4, 16-1 through 16-3 and 17-1 through 17-5.

Formula 14

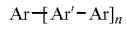

n: an integer of from 2 to 6

Compound 14-1

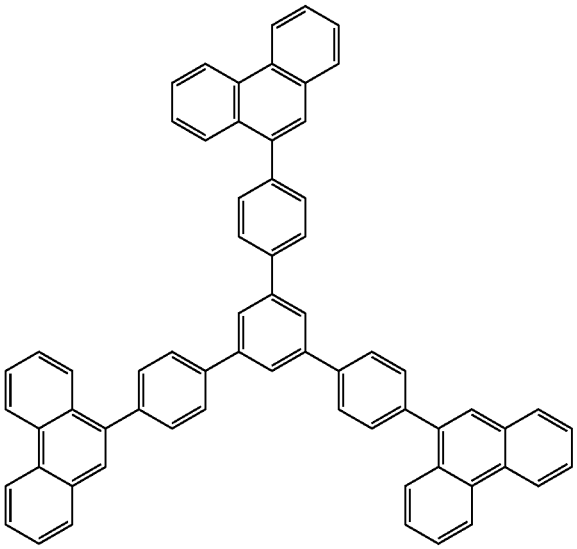

Compound 14-2

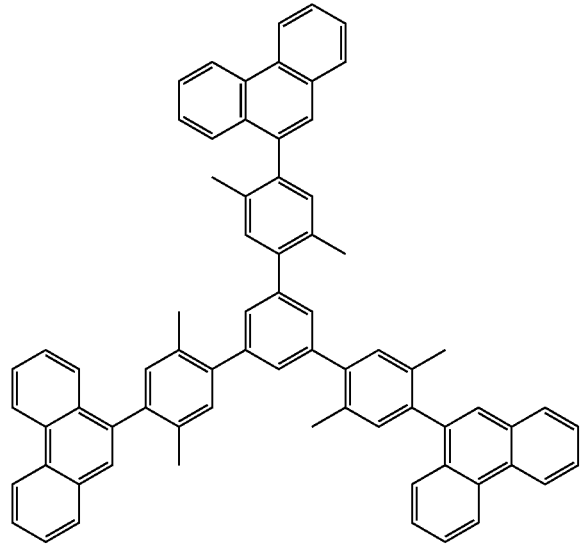

Compound 14-3

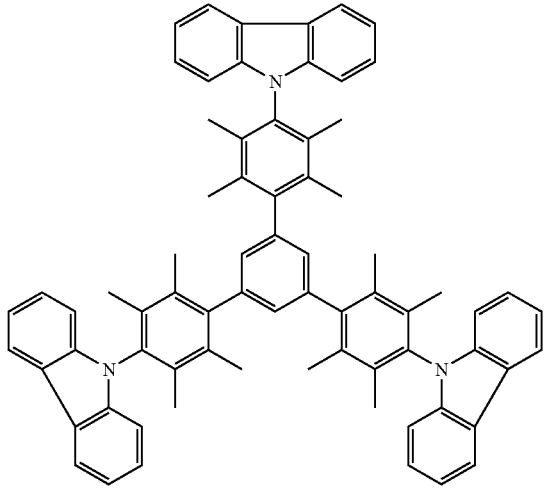

Compound 14-4

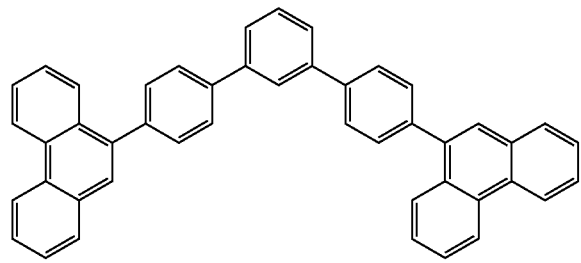

Compound 14-5

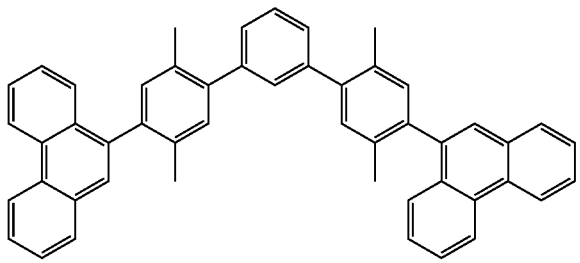

-continued
Compound 14-6
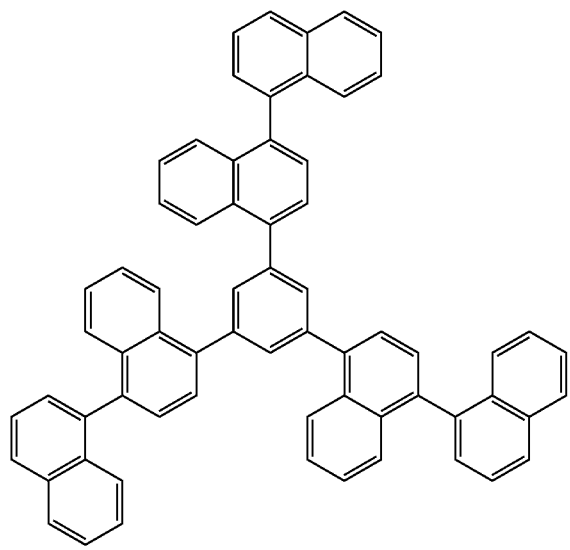
Compound 14-7
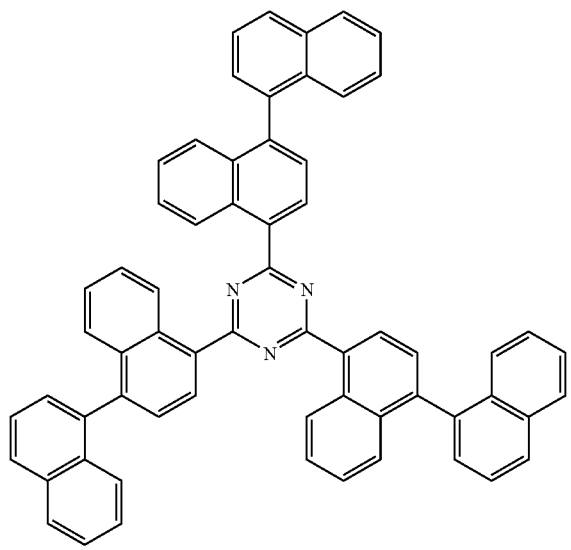
Compound 14-8
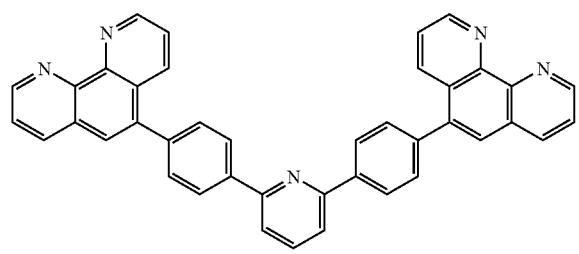
Compound 14-9
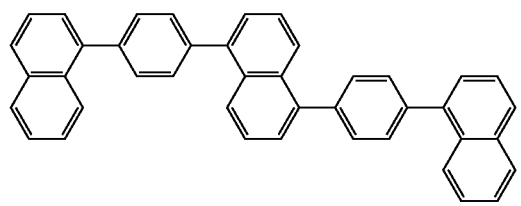
Compound 14-10
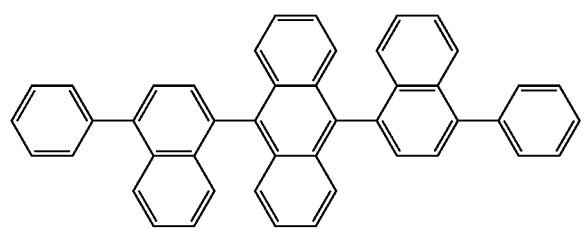
Compound 14-11
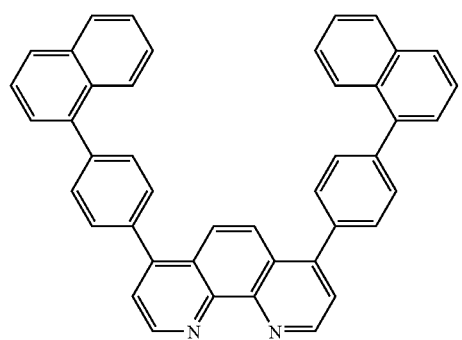

Compound 14-12
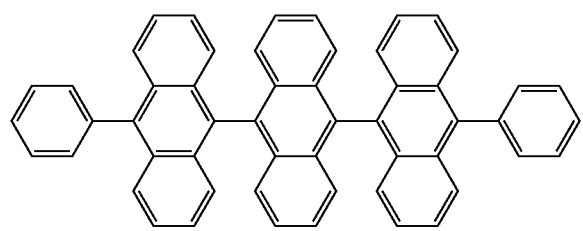
Compound 14-13
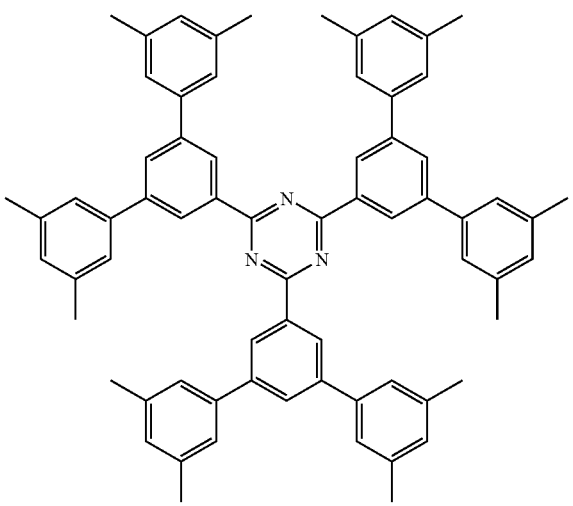
Compound 14-14
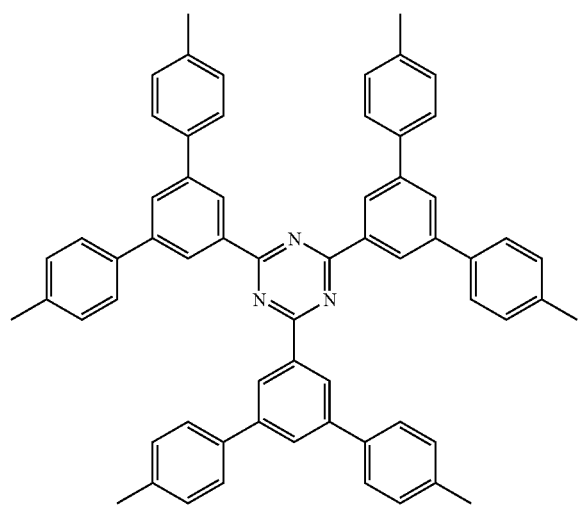
Compound 14-15
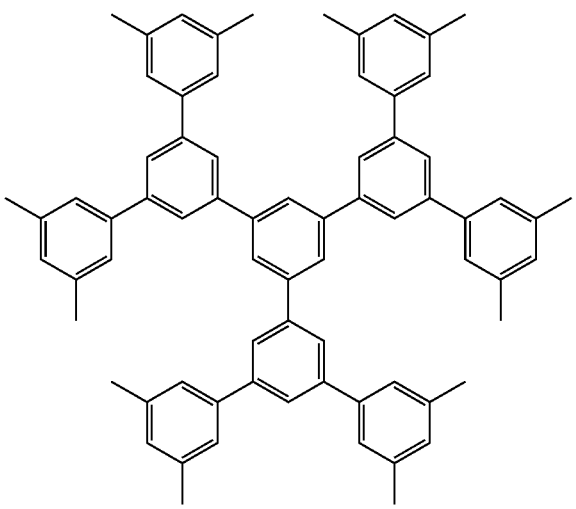
Formula 15
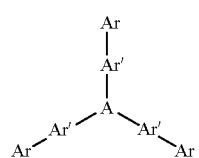
A: N, B or P
Compound 15-1
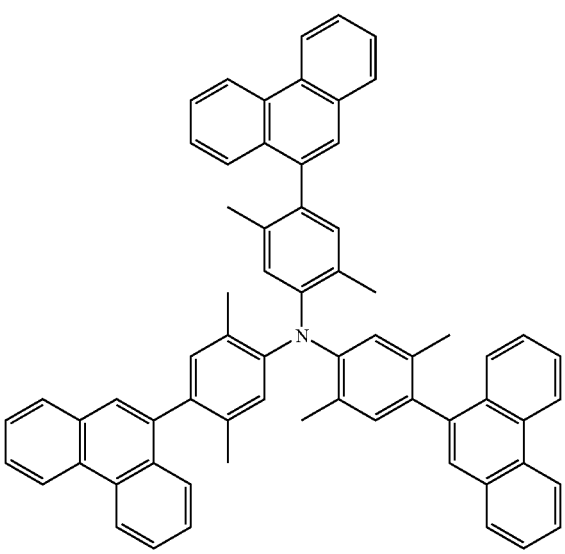

Compound 15-2
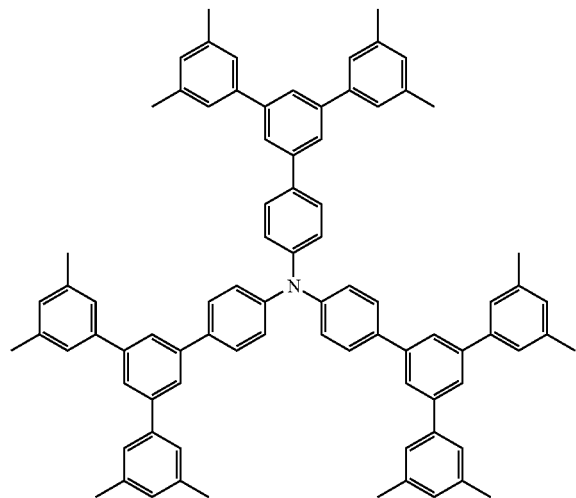
Compound 15-3
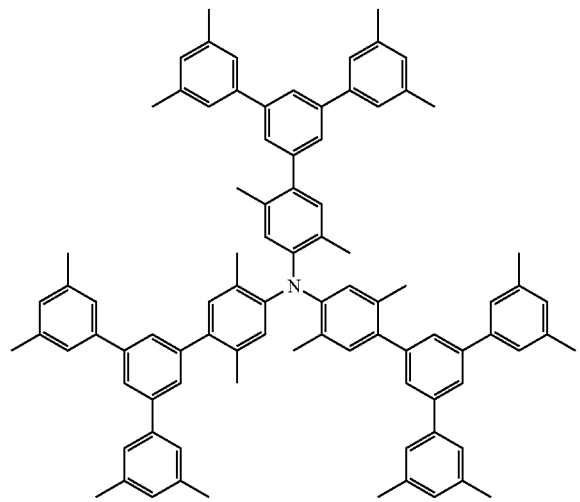
Compound 15-4
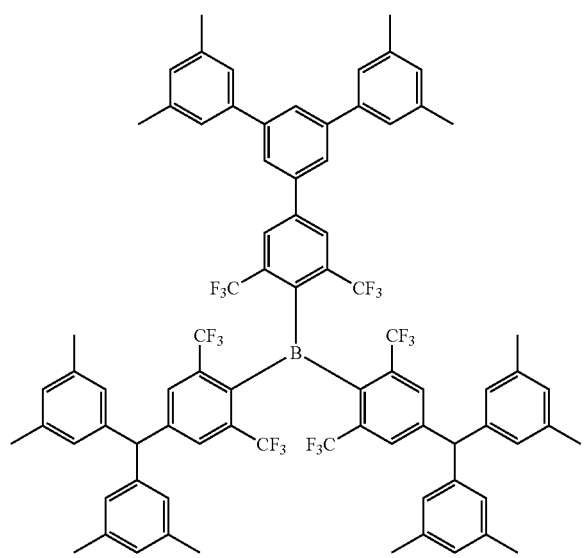
Formula 16
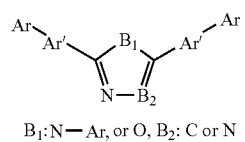
$B_1$: N—Ar, or O, $B_2$: C or N
Compound 16-1
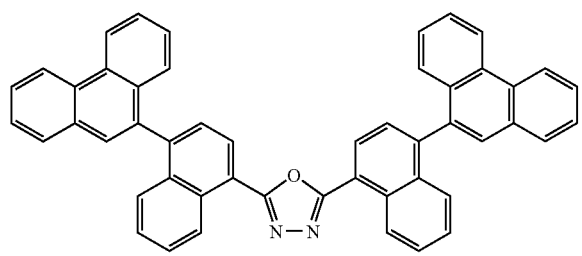
Compound 16-2
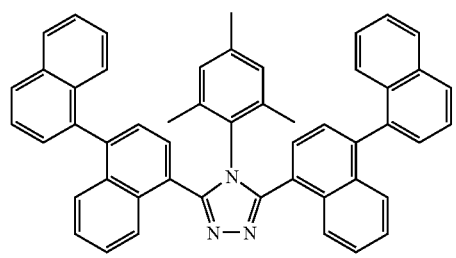

-continued
Compound 16-3
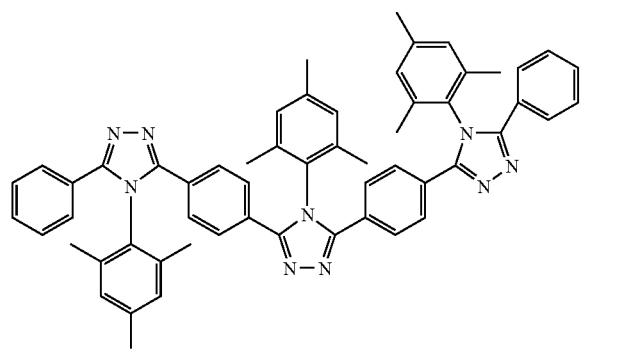
Formula 17
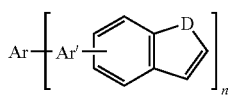
n: an integer of from 2 to 6.
D: N—Ar, S or O
Compound 17-1
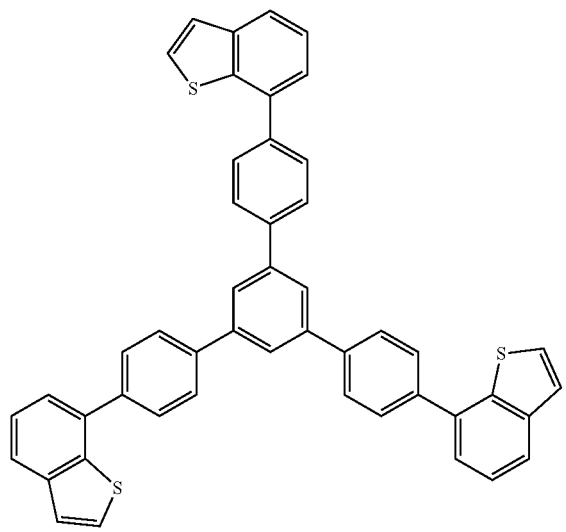
Compound 17-2
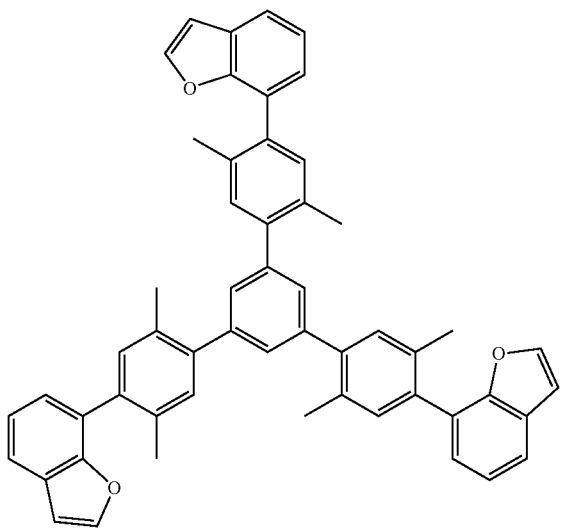
Compound 17-3
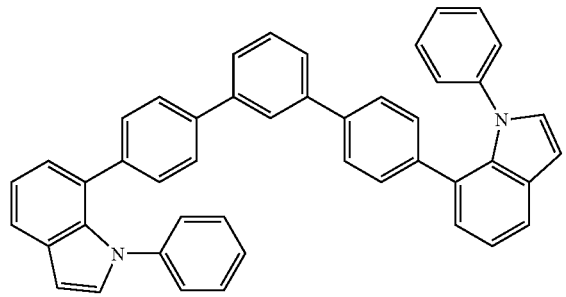
Compound 17-4
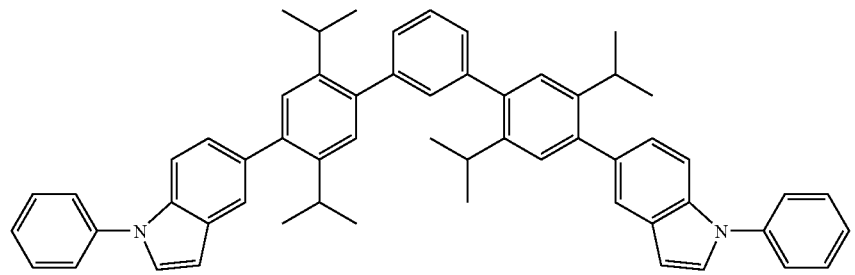

-continued

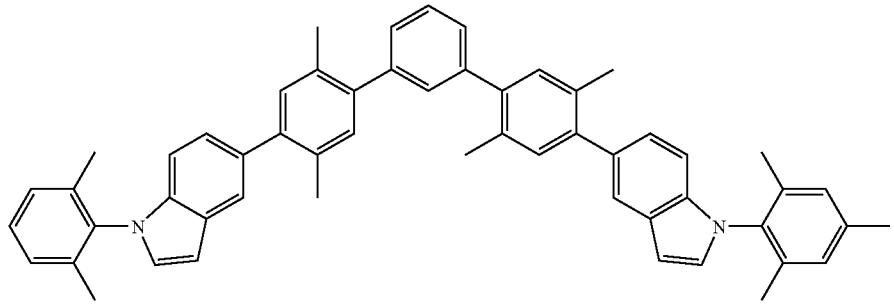

Compound 17-5

In the above, Mw represents a weight average molecular weight, and is measured in terms of polystyrene according to GPC under the following conditions.
GPC apparatus: HLC-8020 (produced by Toso Co., Ltd.
Column used: gcHXL-L+G4000HXL+G2000HXL+GM-HXL
Elution liquid: tetrahydrofuran
Column oven: 40° C.
Flow rate: 1.0 ml/min.

In the compounds represented by the formulae or exemplified compounds as described above, Ar, Ar', R and L are as follows:

Ar represents a hydrogen atom, an aryl group, or a heterocyclic group. The aryl group is preferably an aryl group having a carbon atom number of from 6 to 40 (for example, phenyl, naphthyl, biphenyl, anthryl, phenanthryl, pyrenyl, benzophenanthryl, triphenylenyl, naphthacenyl, chrysenyl, picenyl, perylenyl, pentaphenyl, or pentacenyl), more preferably an aryl group having a carbon atom number of from 6 to 30 (for example, phenyl, naphthyl, anthryl, phenanthryl, pyrenyl, or perylenyl), still more preferably an aryl group having a carbon atom number of from 6 to 20 (for example, phenyl, naphthyl, biphenyl, anthryl, phenanthryl, pyrenyl, or perylenyl), and most preferably phenyl.

The heterocyclic group is preferably a 3 to 10 member heterocyclic group having a nitrogen atom, an oxygen atom or a sulfur atom. Examples of the heterocyclic group include pyrrolidinyl, piperidyl, piperazinyl, morpholinyl, thienyl, furyl, pyrrolyl, imidazolyl, pyrazolyl, pyridyl, pyrazinyl, pyridazinyl, pyrimidyl, triazolyl, triazinyl, indolyl, indazolyl, purinyl, thiazolinyl, thiazolyl, thiadiazolyl, oxazolinyl, oxazolyl, oxadiazolyl, quinolinyl, isoquinolinyl, phthalazinyl, naphtyridinyl, quinoxalinyl, quinazolinyl, cinnolinyl, pteridinyl, acridinyl, phenanthrolinyl, phenazinyl, tetrazolyl, benzimidazolyl, benzoxazolyl, benzothiazolyl, benzotriazolyl, tetrazaindenyl. The heterocyclic group is preferably a 5- or 6-member aromatic heterocyclic group, more preferably thienyl, furyl, pyrrolyl, imidazolyl, pyrazolyl, pyridyl, pyrimidyl, thiazolyl, thiadiazolyl, oxazolyl, oxadiazolyl, quinolinyl, benzimidazolyl, benzoxazolyl, or benzothiazolyl, and still more preferably thienyl, furyl, pyrrolyl, pyridyl, pyrimidyl, thiazolyl, thiadiazolyl, oxazolyl, oxadiazolyl, or quinolinyl.

The above group represented by Ar may have a substituent. Examples of the substituent include an alkyl group (preferably having 1 to 20 carbon atoms, more preferably 1 to 12 carbon atoms, and still more preferably 1 to 8 carbon atoms, such as methyl, ethyl, isopropyl, tert-butyl, n-octyl, n-decyl, n-hexyl, cyclopropyl, cyclopentyl, cyclohexyl, etc.); a fluorine-containing hydrocarbon group (such as a fluoromethyl, trifluoreomethyl, pentafluoroethyl, pentafluorophenyl, etc.), an alkenyl group (preferably having 2 to 20 carbon atoms, more preferably 2 to 12 carbon atoms, and still more preferably 2 to 8 carbon atoms, such as vinyl, allyl, 2-butenyl, 3-pentenyl, etc.); an alkynyl group (preferably having 2 to 20 carbon atoms, more preferably 2 to 12 carbon atoms, and still more preferably 2 to 8 carbon atoms, such as propargyl, 3-pentynyl, etc.); an aryl group (preferably having 6 to 30 carbon atoms, more preferably 6 to 20 carbon atoms, and still more preferably 6 to 12 carbon atoms, such as phenyl, p-methylphenyl, naphthyl, etc.); an amino group (preferably having 0 to 20 carbon atoms, more preferably 0 to 10 carbon atoms, and still more preferably 0 to 6 carbon atoms, such as amino, methylamino, dimethylamino, diethylamino, dibenzylamino, etc.); an alkoxy group (preferably having 1 to 20 carbon atoms, more preferably 1 to 12 carbon atoms, and still more preferably 1 to 8 carbon atoms, such as methoxy, ethoxy, butoxy, etc.), an aryloxy group (preferably having 6 to 20 carbon atoms, more preferably 6 to 16 carbon atoms, and still more preferably 6 to 12 carbon atoms, such as phenoxy, naphthoxy, etc.); an acyl group (preferably having 1 to 20 carbon atoms, more preferably 1 to 16 carbon atoms, and still more preferably 1 to 12 carbon atoms, such as acetyl, benzoyl, formyl, pivaloyl, etc.); an alkoxycarbonyl group (preferably having 2 to 20 carbon atoms, more preferably 2 to 16 carbon atoms, and still more preferably 2 to 12 carbon atoms, such as methoxycarbonyl, ethoxycarbonyl, etc.); an aryloxycarbonyl group preferably having 7 to 20 carbon atoms, more preferably 7 to 16 carbon atoms, and still more preferably 7 to 12 carbon atoms, such as phenyoxycarbonyl); an acyloxy group (preferably having 2 to 20 carbon atoms, more preferably 2 to 16 carbon atoms, and still more preferably 2 to 12 carbon atoms, such as acetoxy, benzoyloxy, etc.); an acylamino group (preferably having 2 to 20 carbon atoms, more preferably 2 to 16 carbon atoms, and still more preferably 2 to 12 carbon atoms, such as acetylamino, benzoylamino, etc.); an alkoxycarbonylamino group (preferably having 2 to 20 carbon atoms, more preferably 2 to 16 carbon atoms, and still more preferably 2 to 12 carbon atoms, such as methoxycarbonylamino), an aryloxycarbonylamino group (preferably having 7 to 20 carbon atoms, more preferably 7 to 16 carbon atoms, and still more preferably 7 to 12 carbon atoms, such as phenyloxycarbonylamino); a sulfonylamino group (preferably having 1 to 20 carbon atoms, more preferably 1 to 16 carbon atoms, and still more preferably 1 to 12 carbon atoms, such as methanesulfonylamino, benzenesulfonylamino, etc.); a sulfamoyl group (preferably having 0 to 20 carbon atoms, more preferably 0 to 16 carbon atoms, and still more preferably 0 to 12 carbon atoms, such as sulfamoyl, methylsulfamoyl, dimethylsulfamoyl, etc.); a carbamoyl group (preferably having 1 to 20 carbon atoms, more preferably 1 to 16 carbon atoms, and still more preferably 1 to 12 carbon atoms, such as carbamoyl, methylcarbamoyl, diethylcarbamoyl, phenylcarbamoyl, etc.); an alkilthio group (preferably having 1 to 20 carbon atoms, more preferably 1 to 16 carbon atoms, and still more preferably 1 to 12 carbon atoms, such as methylthio, ethylthio, etc.); an arylthio group (preferably having 6 to 20 carbon atoms, more preferably 6 to 16 carbon atoms, and still more preferably 6 to 12 carbon atoms, such as phenylthio, etc.); a sulfonyl group (preferably having 1 to 20 carbon atoms, more preferably 1 to 16 carbon atoms, and still more preferably 1 to 12 carbon atoms, such as mesyl, tosyl, etc.); a sulfinyl group (preferably having 1 to 20 carbon atoms, more preferably 1 to 16 carbon atoms, and still more preferably 1 to 12 carbon atoms, such as methanesufinyl, benzenesufinyl, etc.); a ureido group (preferably having 1 to 20 carbon atoms, more preferably 1 to 16 carbon atoms, and still more preferably 1 to 12 carbon atoms, such as ureido, methylureido, phenylureido); a phosphoramide group (preferably having 1 to 20 carbon atoms, more preferably 1 to 16 carbon atoms, and still more preferably 1 to 12 carbon atoms, such as diethylphosphoramide, phenylphosphoramide, etc.); a hydroxyl group; a halogen atom (e.g., fluorine, chlorine, bromine, iodine); a cyano group; a sulfo group; a carboxyl group; a nitro group; a hydroxamic acid group; a sulfino group; a hydrazino group; an imino group, a heterocyclic group (preferably having 1 to 30 carbon atoms, and more preferably 1 to 12 carbon atoms, such as imidazolyl, pyridyl, quinolyl, furyl, piperidyl, morpholino, benzoxazolyl, benzimidazolyl, benzothiazolyl, etc.). etc.); and a silyl group (preferably having 3 to 40 carbon atoms, and more preferably 3 to 30, and still more preferably having 3 to 24 carbon atoms, such as trimethylsilyl, triphenylsilyl, etc.). When Ar has two or more substituents, they may be the same or different, and may combine with each other to form a ring. These substituents may further have a substituent. The latter substituent is preferably an alkyl group, a fluorine-containing hydrocarbon group, an alkenyl group, an aralkyl group, an aryl group, an alkoxy group, an aryloxy group, an alkilthio group, an arylthio group, a halogen atom, a cyano group, or a heterocyclic group, more preferably an alkyl group, an aryl group, an alkoxy group, an aryloxy group, an alkilthio group, an arylthio group, or a heterocyclic group, and still more preferably an aryl group or an aromatic heterocyclic group.

Ar' represents a substituted or unsubstituted arylene or divalent heterocyclic group. The arylene preferably have 6 to 60 carbon atoms, more preferably 6 to 40, and still more preferably 6 to 30 carbon atoms. Examples of the arylene group include phenylene, bipnenylene, triphenylene, tetraphenylene, naphthalenediyl, anthracenediyl, phenanthrolinediyl, pyrenediyl, benxophenenthrolinediyl, perylenediyl, pentaphenylene, and pentacenediyl. The arylene group is preferably phenylene, bipnenylene, triphenylene, tetraphenylene, naphthalenediyl, anthracenediyl, phenanthrolinediyl, pyrenediyl, or perylenediyl, more preferably phenylene, bipnenylene, triphenylene, or naphthalenediyl, and most preferably phenylene, bipnenylene, or triphenylene.

The divalent heterocyclic group is preferably a heterocyclic group having a carbon atom number of from 4 to 60, more preferably a heterocyclic group having a carbon atom number of from 4 to 60 containing a nitrogen atom, an oxygen atom or a sulfur atom, and still more preferably a 5- or 6-member aromatic heterocyclic group having a carbon atom number of from 4 to 30. Examples of the divalent heterocyclic group include pyrroldiyl, furanediyl, thienylene, pyridinediyl, pyridazinediyl, pyrimidinediyl, pyrazinediyl, quinolinediyl, isoquinolinediyl, cinnolinediyl, quinazolinediyl, quinoxalinediyl, phthalazinediyl, pteridinediyl, acridinediyl, phenazinediyl, and phenanthrolinediyl. The divalent heterocyclic group is preferably furanediyl, thienylene, pyridinediyl, pyridazinediyl, pyrimidinediyl, quinoxalinediyl, or, and more preferably thienylene or pyridinediyl.

The substituent of the substituted arylene or divalent heterocyclic group represented by Ar' are the same as those denoted in Ar above. The substituent is preferably alkyl, alkenyl, aralkyl, aryl, alkoxy, aryloxy, alkylthio, arylthio, halogen, cyano, or heterocyclic, more preferably alkyl, alkenyl, aryl, alkoxy, aryloxy, alkylthio, arylthio, or heterocyclic, and still more preferably alkyl or aryl.

Ar represents a hydrogen atom, an aryl group, or a heterocyclic group. The aryl group is preferably an aryl group having a carbon atom number of from 6 to 40 (for example, phenyl, naphthyl, biphenyl, anthryl, phenanthryl, pyrenyl, benzophenanthryl, triphenylenyl, naphthacenyl, chrysenyl, picenyl, perylenyl, pentaphenyl, or pentacenyl), more preferably an aryl group having a carbon atom number of from 6 to 30 (for example, phenyl, naphthyl, anthryl, phenanthryl, pyrenyl, or perylenyl), still more preferably an aryl group having a carbon atom number of from 6 to 20 (for example, phenyl, naphthyl, biphenyl, anthryl, phenanthryl, pyrenyl, or perylenyl), and most preferably phenyl.

The heterocyclic group is preferably a 3 to 10 member heterocyclic group having a nitrogen atom, an oxygen atom or a sulfur atom. Examples of the heterocyclic group include pyrrolidinyl, piperidyl, piperazinyl, morpholinyl, thienyl, furyl, pyrrolyl, imidazolyl, pyrazolyl, pyridyl, pyrazinyl, pyridazinyl, pyrimidyl, triazolyl, triazinyl, indolyl, indazolyl, purinyl, thiazolinyl, thiazolyl, thiadiazolyl, oxazolinyl, oxazolyl, oxadiazolyl, quinolinyl, isoquinolinyl, phthalazinyl, quinoxalinyl, quinazolinyl, cinnolinyl, pteridinyl, acridinyl, phenanthrolinyl, phenazinyl, tetrazolyl, benzimidazolyl, benzoxazolyl, benzothiazolyl, benzotriazolyl, tetrazaindenyl. The heterocyclic group is preferably a 5- or 6-member aromatic heterocyclic group, more preferably thienyl, furyl, pyrrolyl, imidazolyl, pyrazolyl, pyridyl, pyrimidyl, thiazolyl, thiadiazolyl, oxazolyl, oxadiazolyl, quinolinyl, benzimidazolyl, benzoxazolyl, or benzothiazolyl, and still more preferably thienyl, furyl, pyrrolyl, pyridyl, pyrimidyl, thiazolyl, thiadiazolyl, oxazolyl, oxadiazolyl, or quinolinyl.

R represents a hydrogen atom or a substituent. Examples of the substituent include an alkyl group (preferably having 1 to 20 carbon atoms, more preferably 1 to 12 carbon atoms, and still more preferably 1 to 8 carbon atoms, such as methyl, ethyl, isopropyl, tert-butyl, n-octyl, n-decyl, n-hexyl, cyclopropyl, cyclopentyl, cyclohexyl, etc.); a fluorine-containing hydrocarbon group (such as a fluoromethyl, trifluoremethyl, pentafluoroethyl, pentafluorophenyl, etc.), an alkenyl group (preferably having 2 to 20 carbon atoms, more preferably 2 to 12 carbon atoms, and still more preferably 2 to 8 carbon atoms, such as vinyl, allyl, 2-butenyl, 3-pentenyl, etc.); an alkynyl group (preferably having 2 to 20 carbon atoms, more preferably 2 to 12 carbon atoms, and still more preferably 2 to 8 carbon atoms, such as propargyl, 3-pentynyl, etc.); an aryl group (preferably having 6 to 30 carbon atoms, more preferably 6 to 20 carbon atoms, and still more preferably 6 to 12 carbon atoms, such as phenyl, p-methylphenyl, naphthyl, etc.); an amino group (preferably having 0 to 20 carbon atoms, more preferably 0 to 10 carbon atoms, and still more preferably 0 to 6 carbon atoms, such as amino, methylamino, dimethylamino, diethylamino, dibenzylamino, etc.); an alkoxy group (preferably having 1 to 20 carbon atoms, more preferably 1 to 12 carbon atoms, and still more preferably 1 to 8 carbon atoms, such as methoxy, ethoxy, butoxy, etc.), an aryloxy group (preferably having 6 to 20 carbon atoms, more preferably 6 to 16 carbon atoms, and still more preferably 6 to 12 carbon atoms, such as phenoxy, naphthoxy, etc.); an acyl group (preferably having 1 to 20 carbon atoms, more preferably 1 to 16 carbon atoms, and still more preferably 1 to 12 carbon atoms, such as acetyl, benzoyl, formyl, pivaloyl, etc.); an alkoxycarbonyl group (preferably having 2 to 20 carbon atoms, more preferably 2 to 16 carbon atoms, and still more preferably 2 to 12 carbon atoms, such as methoxycarbonyl, ethoxycarbonyl, etc.); an aryloxycarbonyl group preferably having 7 to 20 carbon atoms, more preferably 7 to 16 carbon atoms, and still more preferably 7 to 12 carbon atoms, such as phenyoxycarbonyl); an acyloxy group (preferably having 2 to 20 carbon atoms, more preferably 2 to 16 carbon atoms, and still more preferably 2 to 12 carbon atoms, such as acetoxy, benzoyloxy, etc.); an acylamino group (preferably having 2 to 20 carbon atoms, more preferably 2 to 16 carbon atoms, and still more preferably 2 to 12 carbon atoms, such as acetylamino, benzoylamino, etc.); an alkoxycarbonylamino group (preferably having 2 to 20 carbon atoms, more preferably 2 to 16 carbon atoms, and still more preferably 2 to 12 carbon atoms, such as methoxycarbonylamino), an aryloxycarbonylamino group (preferably having 7 to 20 carbon atoms, more preferably 7 to 16 carbon atoms, and still more preferably 7 to 12 carbon atoms, such as phenyloxycarbonylamino); a sulfonylamino group (preferably having 1 to 20 carbon atoms, more preferably 1 to 16 carbon atoms, and still more preferably 1 to 12 carbon atoms, such as methanesulfonylamino, benzenesulfonylamino, etc.); a sulfamoyl group (preferably having 0 to 20 carbon atoms, more preferably 0 to 16 carbon atoms, and still more preferably 0 to 12 carbon atoms, such as sulfamoyl, methylsulfamoyl, dimethylsulfamoyl, etc.); a carbamoyl group (preferably having 1 to 20 carbon atoms, more preferably 1 to 16 carbon atoms, and still more preferably 1 to 12 carbon atoms, such as carbamoyl, methylcarbamoyl, diethylcarbamoyl, phenylcarbamoyl, etc.); an alkilthio group (preferably having 1 to 20 carbon atoms, more preferably 1 to 16 carbon atoms, and still more preferably 1 to 12 carbon atoms, such as methylthio, ethylthio, etc.); an arylthio group (preferably having 6 to 20 carbon atoms, more preferably 6 to 16 carbon atoms, and still more preferably 6 to 12 carbon atoms, such as phenylthio, etc.); a sulfonyl group (preferably having 1 to 20 carbon atoms, more preferably 1 to 16 carbon atoms, and still more preferably 1 to 12 carbon atoms, such as mesyl, tosyl, etc.); a sulfinyl group (preferably having 1 to 20 carbon atoms, more preferably 1 to 16 carbon atoms, and still more preferably 1 to 12 carbon atoms, such as methanesufinyl, benzenesufinyl, etc.); a ureido group (preferably having 1 to 20 carbon atoms, more preferably 1 to 16 carbon atoms, and still more preferably 1 to 12 carbon atoms, such as ureido, methylureido, phenylureido); a phosphoramide group (preferably having 1 to 20 carbon atoms, more preferably 1 to 16 carbon atoms, and still more preferably 1 to 12 carbon atoms, such as diethylphosphoramide, phenylphosphoramide, etc.); a hydroxyl group; a halogen atom (e.g., fluorine, chlorine, bromine, iodine); a cyano group; a sulfo group; a carboxyl group; a nitro group; a hydroxamic acid group; a sulfino group; a hydrazino group; an imino group, a heterocyclic group (preferably having 1 to 30 carbon atoms, and more preferably 1 to 12 carbon atoms, such as imidazolyl, pyridyl, quinolyl, furyl, piperidyl, morpholino, benzoxazolyl, benzimidazolyl, benzothiazolyl, etc.). etc.); and a silyl group (preferably having 3 to 40 carbon atoms, and more preferably 3 to 30, and still more preferably having 3 to 24 carbon atoms, such as trimethylsilyl, triphenylsilyl, etc.). When two or more R's exist in the molecule, they may be the same or different, and may combine with each other to form a ring. These substituents may further have a substituent. The latter substituent is preferably an alkyl group, a fluorine-containing hydrocarbon group, an alkenyl group, an aralkyl group, an aryl group, an alkoxy group, an aryloxy group, an alkilthio group, an arylthio group, a halogen atom, a cyano group, or a heterocyclic group, more preferably an alkyl group, an aryl group, an alkoxy group, an aryloxy group, an alkilthio group, an arylthio group, or a heterocyclic group, and still more preferably an aryl group or an aromatic heterocyclic group.

L represents a divalent linkage group, and preferably a divalent linkage group having —O—, —CO—, —SO$_2$—, —COO—, or —NHCO— in the group.

The polymers or compounds as described above may be doped with a dopant as necessary. As the dopant there is an emission dopant or a charge transporting dopant. As the emission dopant there is a fluorescent dopant or a phosphorescent dopant, and the emission dopant used is selected therefrom according to emission color to be desired. The fluorescent dopant is preferably a compound with high fluorescent quantum yield, for example, a laser dye.

The fluorescent dopant is preferably a compound with high fluorescent quantum yield, which is represented by a laser dye. The phosphorescent dopant is preferably a compound capable of emitting phosphorescence at room temperature, more preferably an orthometal complex or a platinum complex, and still more preferably an iridium complex. Examples thereof include compounds 18-1, 18-2, and 18-3 listed below.

Compound 18-1

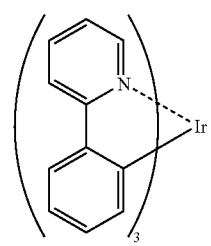

Compound 18-2

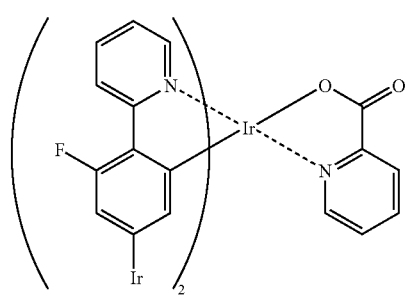

Compound 18-3

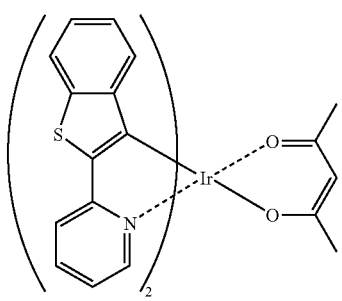

As the charge transporting dopant there is a hole transporting dopant or an electron transporting dopant. As the hole transporting dopant, there are aromatic amines, and as the electron transporting dopant, there are heterocyclic compounds.

As the electron transporting materials in the electron transporting layer, the polymers or compounds denoted in the light emission layer above can be used. These materials may be doped with an electron transporting dopant such as a heterocyclic compound as necessary. The polymers described above may be mixed with another polymer. The monomers used when the above polymers are synthesized are mixed with another monomer and polymerized to prepare a copolymer or a block polymer, which may be used in the invention.

When the layers described above are simultaneously multilayer-coated on a substrate employing layer coating liquids thereof, a first solvent used in the coating liquid of a first layer and a second solvent used in the coating liquid of a second layer adjacent to each other are selected from those which dissolve the compounds described above, provided that the first solvent is immiscible with the second solvent. For example, a hole transporting layer coating liquid, in which PEDOT/PSS is dissolved in water, and a light emission layer coating liquid, in which RO-PPV is dissolved in toluene, are simultaneously multilayer-coated at room temperature.

When two or more organic layers are provided on a substrate, and a first organic layer and a second organic layer coating solution adjacent to the first layer coating solution are coated on a substrate, and a first solvent for the first organic layer coating solution and a second solvent for the second organic layer coating solution, which are immiscible with each other, cannot be employed for the reason of some properties of organic materials dissolved in them, one of the first and second organic layer is separately provided on the substrate according to an vacuum deposition method, an ink jet method, a printing method, or a spin coating method. However, an intermediate liquid layer solvent, and the first and second organic layer coating solutions can be simultaneously coated on a substrate, the intermediate liquid layer solvent being immiscible with both the first and second solvents, so that the intermediate liquid layer solvent is provided between the first and second organic layer coating solutions to form the first and second organic layers.

The intermediate liquid layer solvent is selected from those which are immiscible with solvents used for coating the layers adjacent to the intermediate liquid layer. Provision of such an intermediate liquid layer prevents materials contained in the layers adjacent to each other from diffusing during simultaneous multilayer coating to give laminated layers without undesired mixing of the materials. For example, there is a method in which a PVTPA dichlorobenzene solution for a hole transporting layer, an intermediate liquid (water) layer, and an RO-PPV toluene solution for a light emission layer are simultaneously multilayer-coated in that order.

The solvents which are immiscible with each other means those such that when two solvent layers adjacent to each other are formed, the layers are not mixed, but a liquid-liquid interface is formed between the two liquid layers. When the liquid-liquid interface is formed, temperature, at which coating is carried out, is not specifically limited. The solvent constituting one coating solution layer may be comprised of one solvent or two or more kinds of solvents.

In order to select these solvents or coating temperature, those described, for example in "Kagakubinran", Kisohen II, p. 686-696, published by Maruzen Co., Ltd. may be referred to.

As the simultaneous multilayer coating method, there is a slide coating method, a slot coating method, an extrusion coating method, or a curtain coating method. The slide coating method or a slot coating method is preferred, and the slot coating method is more preferred.

FIG. 1 is an illustration of a slot coating method simultaneously coating two layers on a substrate.

An organic solvent coating solution 2, which is supplied from a chamber (not illustrated) through pressure application into a slot 13 formed between dies 10 and 11, is overlapped with a coating layer 100 of an aqueous coating solution 1 flowing from a slot 14 formed between dies 11 and 12 to form a coating layer 200, and is provided on a substrate 3, whereby the two coating solutions were simultaneously coated on the substrate. This method makes it possible to conduct continuous coating on a flexible substrate with a long length. Therefore, this method is advantageous in manufacturing an organic electroluminescent element used in a device with a large area such as an illuminating lamp. When an organic electroluminescent element is used as an illuminating lamp, an organic electroluminescent element is preferred, which emits a white light or a blue light each being based on phosphorescence. Such an organic electroluminescent element can be advantageously manufactured according to the method of the invention.

The organic EL element of the invention can be used as a display device (a display) or a light emission source. The display can present a full color image, employing three kinds of organic EL elements, that is, an element emitting a blue light, an element emitting a red light, and an element emitting a green light.

Examples of the display include a television, a personal computer, a mobile device or an AV device, a display for text broadcasting, and an information display used in a car. The display may be used as particularly a display for reproducing a still image or a moving image. When the display is used as a display for reproducing a moving image, the driving method may be either a simple matrix (passive matrix) method or an active matrix method.

Examples of the light emission source include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor. The organic EL element of the invention is more suitably used as various lamps.

EXAMPLES

The present invention will be explained in the following examples, but is not limited thereto.

Example 1

Fifty grams of PEDOT/PSS were dissolved in 5 liters of water to prepare an aqueous 1.0% PEDOT/PSS solution (hereinafter referred to as solution 1). Fifty grams of polymer A described below were dissolved in 5 liters of toluene to prepare a 1.0% toluene solution of polymer A (hereinafter referred to as solution 2).

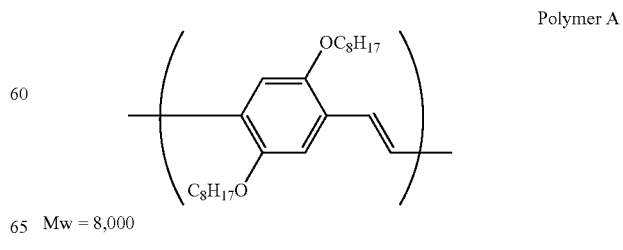

Polymer A

Mw = 8,000

The solutions 1 and 2 were simultaneously coated at a coating speed of 30 m/minute on an ITO film (produced by Sanyo Shinku Co., Ltd.) through a slot method, so that a PEDOT/PSS layer with a wet thickness of 5 µm and a polymer A layer with a wet thickness of 10 µm were provided on the ITO film in that order, and dried at 80° C. for 3 hours under vacuum at to obtain a PEDOT/PSS layer with a dry thickness of 50 nm and a polymer A layer with a dry thickness of 100 nm.

Subsequently, a 0.5 nm LiF layer and a 130 nm Al layer were deposited in that order on the resulting material under a pressure of $1 \times 10^{-4}$ Pa. Thus, organic electroluminescence element sample was obtained.

When a voltage of 10 V was applied to the sample set the ITO as an anode and the Al layer as a cathode, orange color El emission was obtained.

Example 2

Fifty grams of PVCz were dissolved in 5 liters of dichlorobenzene to prepare an aqueous 1.0% PVCz dichlorobenzene solution (hereinafter referred to as solution 3). Fifty grams of compound 13-2 were dissolved in 5 liters of dichlorobenzene to prepare a 1.0% dichlorobenzene solution of compound 13-2 (hereinafter referred to as solution 4).

Solution 1, solution 3, an intermediate liquid layer (water) and solution 4 were simultaneously coated at a coating speed of 30 m/minute on an ITO film (produced by Sanyo Shinku Co., Ltd.) through a slot method, so that a PEDOT/PSS layer with a wet thickness of 5 µm, a PVCZ layer with a wet thickness of 3 µm, an intermediate liquid layer with a wet thickness of 5 µm, and a compound 13-2 layer with a wet thickness of 5 µm were provided on the ITO film in that order, and dried at 80° C. for 3 hours under vacuum to obtain a PEDOT/PSS layer with a dry thickness of 50 nm, a PVCZ layer with a dry thickness of 30 nm and a compound 13-2 layer with a dry thickness of 50 nm.

Subsequently, a 10 nm BC layer, a 30 nm Alq$_3$ layer, a 0.5 nm LiF layer and a 130 nm Al layer were deposited in that order on the resulting material under a pressure of $1 \times 10^{-4}$ Pa. Thus, organic electroluminescence element sample was obtained. When a voltage of 10 V was applied to the sample set the ITO as an anode and the Al layer as a cathode, orange color El emission was obtained.

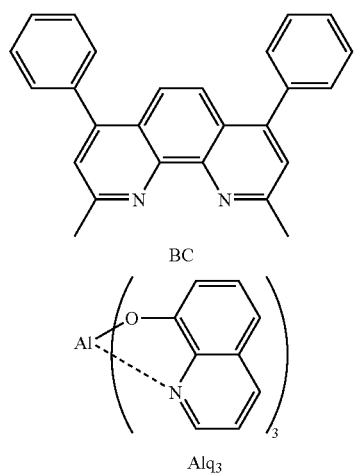

When a voltage of 10 V was applied to the sample set the ITO as an anode and the Al layer as a cathode, green color El emission was obtained.

Example 3

Sixty grams of compound 5-2, 3.6 g of tris{2-(p-toyl)pyridine}iridium, 2.5 g of FIr(pic), and 2.5 g of Btp2Ir(acac) were dissolved in 5 liters of dichlorobenzene to prepare a solution (hereinafter referred to as solution 5).

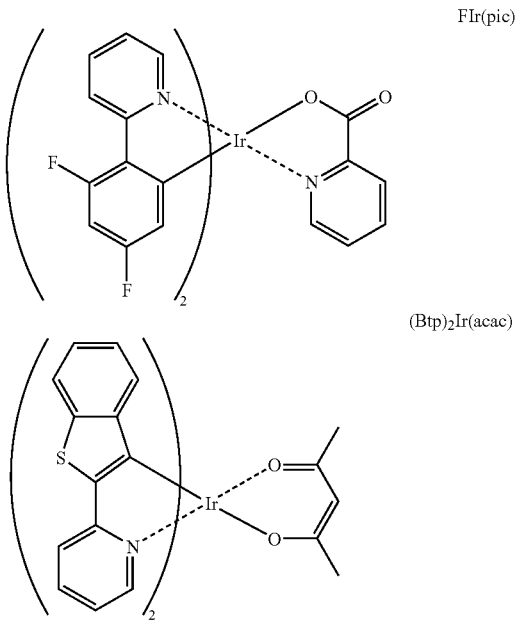

Fifty grams of compound 14-5 were dissolved in 5 liters of dichlorobenzene to prepare a 1.0% dichlorobenzene solution of compound 14-5 (hereinafter referred to as solution 6).

Fifty grams of compound 12-1 were dissolved in 5 liters of dichlorobenzene to prepare a 1.0% dichlorobenzene solution of compound 12-1 (hereinafter referred to as solution 7).

Solution 1, solution 5, a first intermediate liquid layer (water), solution 6, a second intermediate layer (water) and solution 7 were simultaneously coated at a coating speed of 50 m/minute on an ITO film (produced by Sanyo Shinku Co., Ltd.) through a slide method, so that a PEDOT/PSS layer with a wet thickness of 5 µm, a layer of compound 5-2, tris{2-(p-tolyl)pyridine}iridium, FIr(pic) and (Btp)$_2$Ir(acac) with a wet thickness of 4.2 µm, a first intermediate liquid (water) layer with a wet thickness of 5 µm, a compound 14-5 layer with a wet thickness of 2 µm, a second intermediate liquid (water) layer with a wet thickness of 5 µm, and a compound 12-1 layer with a wet thickness of 4 µm were provided on the ITO film in that order, and dried at 80° C. for 3 hours under vacuum to obtain a PEDOT/PSS layer with a dry thickness of 50 nm, a layer of compound 5-2, tris{2-(p-tolyl)pyridine}iridium, FIr(pic) and Btp2Ir(acac) with a dry thickness of 50 µm, a compound 14-5 layer with a dry thickness of 20 nm and a compound 12-1 layer with a dry thickness of 40 nm.

Subsequently, a 0.5 nm LiF layer and a 130 nm Al layer were deposited in that order on the resulting material under a pressure of $1 \times 10^{-4}$ Pa. Thus, organic electroluminescence element sample was obtained. When a voltage of 10 V was applied to the sample set the ITO as an anode and the Al layer as a cathode, white color El emission was obtained. This sample can be used as a white light emission lamp.

Example 4

Striped ITO transparent electrodes with a length of 90 mm and a width of 80 µm of 816 were formed on an ITO film at a pitch of 100 µm.

Sixty grams of compound 5-2 and 3.5 g of FIr(pic) were dissolved in 5 liters of dichlorobenzene to prepare a dichlorobenzene solution of compound 5-2 and FIr(pic) (hereinafter referred to as solution 8).

Solution 1, solution 8, a first intermediate liquid layer (water), solution 6, a second intermediate layer (water) and solution 7 were simultaneously coated at a coating speed of 50 m/minute on an ITO film (produced by Sanyo Shinku Co., Ltd.) through a slide method, so that a PEDOT/PSS layer with a wet thickness of 5 µm, a layer of compound 5-2 and, FIr(pic) with a wet thickness of 4.2 µm, a first intermediate liquid (water) layer with a wet thickness of 5 µm, a compound 14-5 layer with a wet thickness of 2 µm, a second intermediate liquid (water) layer with a wet thickness of 5 µm, and a compound 12-1 layer with a wet thickness of 4 µm were provided on the ITO film obtained above in that order, and dried at 80° C. for 3 hours under vacuum to obtain a PEDOT/PSS layer with a dry thickness of 50 nm, a layer of compound 5-2 and FIr(pic) with a dry thickness of 50 µm, a compound 14-5 layer with a dry thickness of 20 nm and a compound 12-1 layer with a dry thickness of 40 nm.

Subsequently, a 0.5 nm LiF layer was deposited over the entire surface of the resulting material under a pressure of $1 \times 10^{-4}$ Pa.

Figure 2:
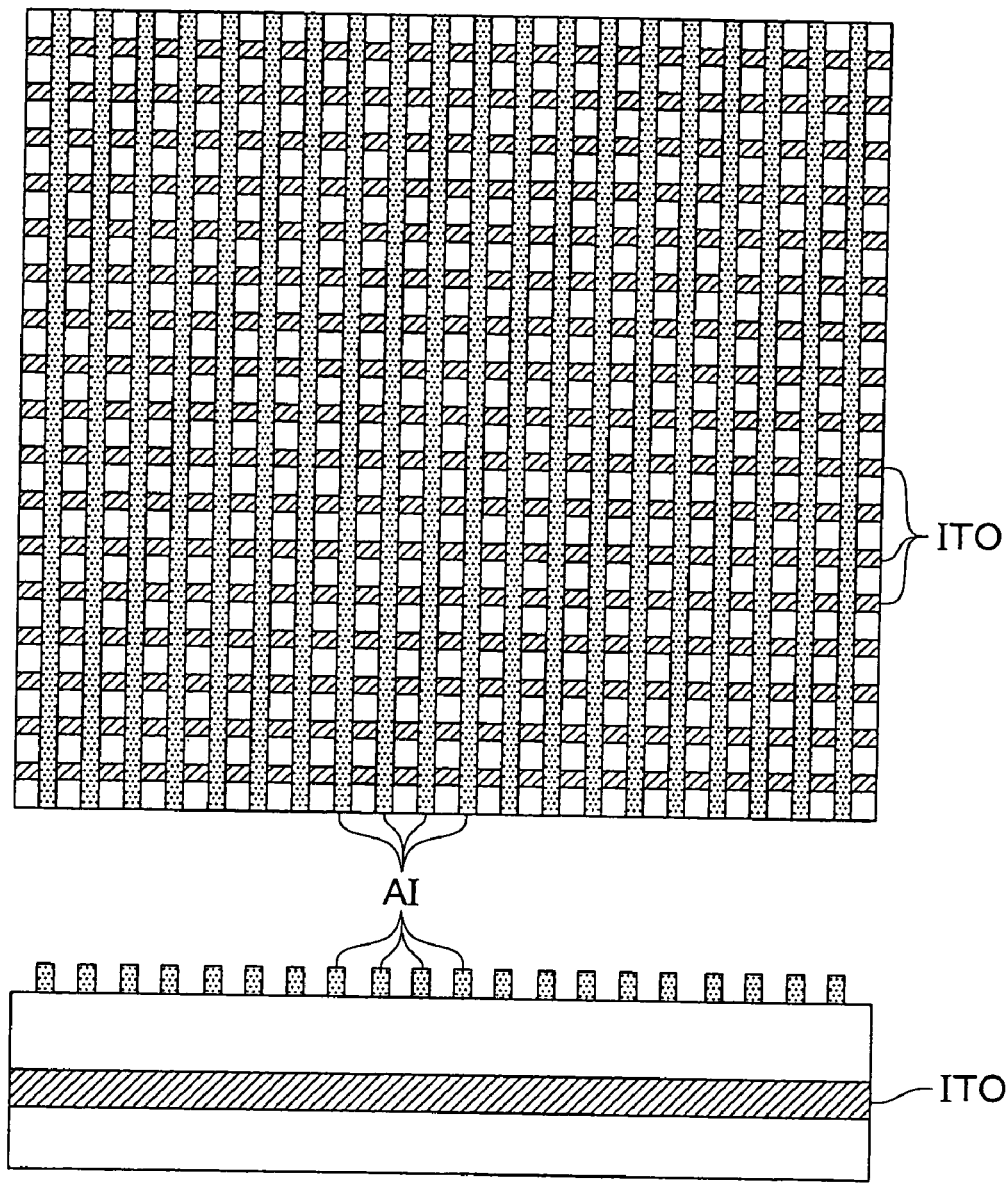
FIG. 2 is an illustration showing an electrode form of an organic EL element.

Subsequently, striped Al layers with a thickness of 130 nm as shown in FIG. 2 were deposited under vacuum on the resulting LiF layer. Thus, organic electroluminescence element sample was obtained. In FIG. 2, ITO shows ITO transparent electrodes.

When a voltage of 10 V was applied to the resulting sample set the ITO as an anode and the Al layer as a cathode, bluish green color El emission was obtained. This EL sample could be driven as a passive matrix display of bluish green monochromatic light. A full color light emission could be obtained by providing a color conversion filter on the sample.

EFFECT OF THE INVENTION

The present provides a method of manufacturing an organic EL element at low cost and at high efficiency, employing a wet process.

What is claimed is:

1. A method of manufacturing an organic electroluminescent element comprising a substrate and provided thereon, a light emission layer containing a light emission material and at least one adjacent layer selected from the group consisting of a hole injecting layer containing a hole injecting material, a hole transporting layer containing a hole transporting material, an electron injecting layer containing an electron injecting material, and an electron transporting layer containing an electron transporting material, the method comprising the steps of (a) providing a first coating solution employing a first organic solvent for a selected one of the light emission layer and the at least one adjacent layer and a second coating solution employing a second solvent for the other one of the selected one of the light emission layer and the at least one adjacent layer, the first solvent being immiscible with the second solvent; (b) simultaneously coating the first and second coating solutions on the substrate so that the first coating solution is in contact with the second coating solution; and (c) drying the coating solutions to form the light emission layer and the at least one adjacent layer on the substrate, wherein the first solvent being immiscible with the second solvent is such that after the first solvent is added to the second solvent in the same amount as the first solvent at 25° C. while stirring, and allowed to stand at 25° C. for 30 to 60 minutes, the resulting liquid is separated into two liquid phases to form an interface between the two liquid phases.

2. The method of claim 1, wherein one of the first and second solvents is water and the other is an organic solvent.

3. The method of claim 1, further comprising the step of forming a layer other than the two layers on the substrate according to a method selected from the group consisting of a vacuum deposition method, an ink jet method, a printing method and a spin coating method.

4. The method of claim 1, wherein the simultaneously coating is carried out employing a slide coating method or a slot coating method.

5. The method of claim 1, wherein the substrate is flexible.

6. The method of claim 1, wherein one layer of the two layer is the light emission layer.

* * * * *